(12) United States Patent
Kim et al.

(10) Patent No.: US 9,324,563 B2
(45) Date of Patent: *Apr. 26, 2016

(54) METHODS OF FORMING PATTERNS

(71) Applicant: Samsung Electronics Co., Ltd., Suwon-si (KR)

(72) Inventors: Kyoungmi Kim, Anyang-si (KR); Joo-Hyung Yang, Suwon-si (KR); Jaeho Kim, Yongin-si (KR); Jungsik Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 30 days.

This patent is subject to a terminal disclaimer.

(21) Appl. No.: 14/299,252

(22) Filed: Jun. 9, 2014

(65) Prior Publication Data

US 2015/0017807 A1    Jan. 15, 2015

(30) Foreign Application Priority Data

Jul. 11, 2013  (KR) ........................ 10-2013-0081629

(51) Int. Cl.
| | |
|---|---|
| *G03F 7/20* | (2006.01) |
| *H01L 21/033* | (2006.01) |
| *H01L 21/308* | (2006.01) |
| *H01L 21/311* | (2006.01) |
| *H01L 21/768* | (2006.01) |
| *H01L 27/108* | (2006.01) |
| *H01L 27/115* | (2006.01) |

(52) U.S. Cl.
CPC .............. *H01L 21/0337* (2013.01); *G03F 7/20* (2013.01); *H01L 21/0338* (2013.01); *H01L 21/3086* (2013.01); *H01L 21/31144* (2013.01); *H01L 21/76816* (2013.01); *H01L 27/10891* (2013.01); *H01L 27/11582* (2013.01)

(58) Field of Classification Search
CPC ........................................................ G03F 7/20
See application file for complete search history.

(56) References Cited

U.S. PATENT DOCUMENTS

| | | | | |
|---|---|---|---|---|
| 6,696,227 | B2 * | 2/2004 | Hsu ..................... | G03F 7/70466 430/322 |
| 7,767,385 | B2 * | 8/2010 | Larson .................. | G03F 7/2022 430/296 |
| 8,035,796 | B2 * | 10/2011 | Iwasaki ............... | G03F 7/70341 355/30 |
| 8,216,774 | B2 | 7/2012 | Hatakeyama | |
| 8,236,483 | B2 | 8/2012 | Ando et al. | |
| 2010/0248134 | A1 | 9/2010 | Kim et al. | |
| 2012/0123135 | A1 | 5/2012 | Bradford et al. | |
| 2013/0089986 | A1 | 4/2013 | Park et al. | |

FOREIGN PATENT DOCUMENTS

| | | |
|---|---|---|
| KR | 1020090010746 | 1/2009 |
| KR | 1020100109111 | 10/2010 |
| KR | 1020110091213 | 8/2011 |
| KR | 1020110101405 | 9/2011 |
| KR | 1020110114046 | 10/2011 |
| KR | 1020130039124 | 4/2013 |

* cited by examiner

*Primary Examiner* — Kathleen Duda

(74) *Attorney, Agent, or Firm* — Myers Bigel & Sibley, P.A.

(57) ABSTRACT

Methods of forming patterns are provided. The methods may include sequentially forming an etch-target layer and a photoresist layer on a substrate, exposing two first portions of the photoresist layer to light to transform the two first portions into two first photoresist patterns and exposing a second portion of the photoresist layer to light to transform the second portion into a second photoresist pattern disposed between the two first photoresist patterns. The method may also removing portions of the photoresist layer to leave the two first photoresist patterns and the second photo resist pattern on the etch-target layer such that the etch-target layer is exposed.

20 Claims, 38 Drawing Sheets

METHODS OF FORMING PATTERNS

CROSS-REFERENCE TO RELATED APPLICATION

This U.S. non-provisional patent application claims priority under 35 U.S.C. §119 to Korean Patent Application No. 10-2013-0081629, filed on Jul. 11, 2013, in the Korean Intellectual Property Office, the disclosure of which is hereby incorporated by reference herein in its entirety.

FIELD

The present disclosure generally relates to the field of electronics and, more particularly, to integrated circuit devices.

BACKGROUND OF THE INVENTION

As the densities of semiconductor devices increase, technologies capable of providing fine patterns have been developed. When an exposure process is used to form a photoresist pattern, a width of the photoresist pattern can be determined by Rayleigh's equation.

$R = k1 \cdot \lambda / NA$, where R is a resolution or a minimum distance between resolvable points, k1 is a process parameter, $\lambda$ is a wavelength of light, and NA is a numerical aperture of lens. According to the above equation, in order to reduce the resolution R, k1 or needs to decrease or NA needs to increase. Exposure processes using extreme ultraviolet (EUV; 13.4 nm) light sources may form patterns smaller than patterns formed using exposure processes using 248 nm KrF or 193 nm ArF excimer lasers as light sources because of a short wavelength. However, the exposure processes using extreme ultraviolet light sources may raise manufacturing costs because an EUV exposure process may require, for example, a vacuum system and a reflection-type photomask.

Accordingly, technologies capable of increasing the numerical aperture NA of lens have also been developed. The numerical aperture NA is proportional to $n \cdot \sin \theta$, where n is a refractive index of a medium interposed between the lens and the photoresist. The minimum distance between resolvable points may decrease using the medium having a higher the refractive index. Immersion lithography processes use a medium having a refractive index that is higher than a refractive index of the air and the resolution R thus may increase even if a conventional light source is used. Water having a refractive index of 1.44 may be as the medium of the immersion lithography processes.

SUMMARY

A method of forming a pattern may include forming an etch-target layer on a substrate, forming a photoresist layer on the etch-target layer, performing a first exposure process to transform first portions of the photoresist layer into first photoresist patterns spaced apart from each other and performing a second exposure process to transform second portions of the photoresist layer into second photoresist patterns spaced apart from each other. The method may also include removing portions of the photoresist layer not transformed into the first and second photoresist patterns to expose a top surface of the etch-target layer. Each of the second photoresist patterns may be disposed between two directly adjacent ones of the first photoresist patterns.

According to various embodiments, the method may further include forming mask patterns in gaps between the first and second photoresist patterns after removing the portions of the photoresist layer, removing the first and second photoresist patterns and etching the etch-target layer using the mask patterns as an etch mask.

In various embodiments, each of the first and second photoresist patterns may have a pillar shape. The mask patterns may be formed of a metal-containing organic layer.

In various embodiments, etching the etch-target layer using the first and second photoresist patterns as an etch mask.

According to various embodiments, each of the first and second photoresist patterns may have a line shape.

According to various embodiments, the photoresist layer may be a negative type.

In various embodiments, the first and second exposure processes may be performed using an immersion lithography process.

In various embodiments, a gap between two directly adjacent ones of the first photoresist patterns and a gap between two directly adjacent ones of the second photoresist patterns may have an equivalent width in a first direction.

According to various embodiments, the method may further include performing a third exposure process to transform third portions of the photoresist layer into third photoresist patterns spaced apart from each other after the second exposure process. Each of the third photoresist patterns may be disposed between one of the first photoresist patterns and one of the second photoresist patterns.

According to various embodiments, each of the first, second and third photoresist patterns may have a line shape. Gaps between the first, second and third photoresist patterns may have an equivalent width in a first direction.

A method of forming a pattern may include forming a photoresist layer on a substrate, performing a plurality of exposure processes to the photoresist layer to transform portions of the photoresist layer into photoresist patterns disposed at different positions and removing portions of the photoresist layer not transformed into the photoresist patterns.

According to various embodiments, the plurality of exposure processes may use respective different photomasks.

In various embodiments, the plurality of exposure processes may use one mask, which may be moved after each of the plurality of exposure processes.

A method of forming an integrated circuit device may include sequentially forming an etch-target layer and a photoresist layer on a substrate, exposing two first portions of the photoresist layer to light to transform the two first portions into two first photoresist patterns and exposing a second portion of the photoresist layer to light to transform the second portion into a second photoresist pattern disposed between the two first photoresist patterns. The method may also include removing portions of the photoresist layer to leave the two first photoresist patterns and the second photoresist pattern on the etch-target layer such that the etch-target layer may be exposed.

In various embodiments, the method may further include forming mask patterns on the etch-target layer in gaps between each of the two first photoresist patterns and the second photoresist pattern after removing the portions of the photoresist layer, removing the two first photoresist patterns and the second photoresist pattern and etching the etch-target layer using the mask patterns as an etch mask.

According to various embodiments, each of the two first photoresist patterns and the second photoresist pattern may have a line shape extending in a direction.

According to various embodiments, the method may further include etching the etch-target layer using the two first photoresist patterns and the second photoresist pattern as an etch mask.

In various embodiments, the method may further include exposing a third portion of the photoresist layer to light to transform the third portion into a third photoresist pattern disposed between one of the two first photoresist patterns and the second photoresist pattern before removing the portions of the photoresist layer. Removing the portions of the photoresist layer may leave the third photoresist pattern on the etch-target layer.

DETAILED DESCRIPTION

Figure 1A:
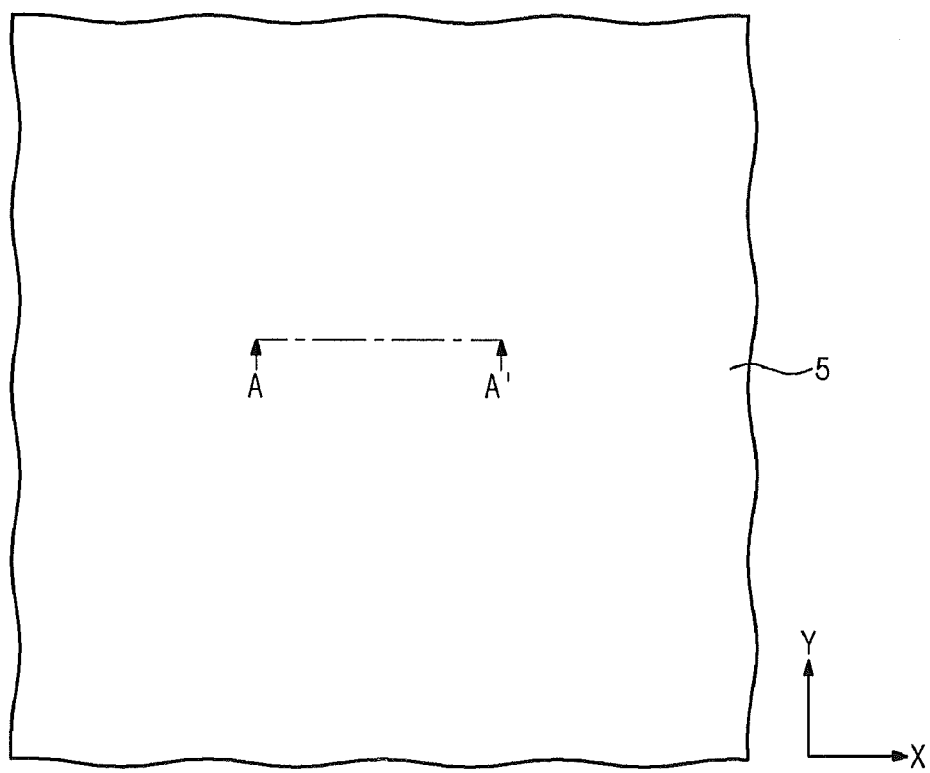
FIGS. 1A, 2A, 3A, 4A, 5A, 6A, 7A and 8A are plan views illustrating a method of forming patterns according to some embodiments of the present inventive concept.

Some embodiments according to the present inventive concept are described below with reference to the accompanying drawings. Many different forms and embodiments are possible without deviating from the spirit and teachings of this disclosure and so the disclosure should not be construed as limited to example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words, for example, "between," "adjacent" or "on" can be interpreted in a like fashion. As used herein the term "and/or" includes any and all combinations of one or more of the associated listed items.

It will be understood that, although the terms "first" or "second" may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of some embodiments.

Spatially relative terms, such as "beneath," "below," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of some embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, steps, operations, elements and/or components, but do not preclude the presence or addition of one or more other features, steps, operations, elements, components and/or groups thereof.

Some embodiments of the present inventive concepts are described herein with reference to cross-sectional, perspective or plan views that are schematic illustrations of idealized embodiments of some embodiments. As such, variations from the shapes of the illustrations as a result, for example, of manufacturing techniques and/or tolerances, are to be expected. Thus, some embodiments of the present inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the scope of some embodiments.

Unless otherwise defined, all terms (including technical and scientific terms) used herein have the same meaning as commonly understood by one of ordinary skill in the art to which some embodiments of the present inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

FIGS. 1A, 2A, 3A, 4A, 5A, 6A, 7A and 8A are plan views illustrating a method of forming patterns according to some embodiments of the present inventive concept. FIGS. 1B, 2B, 3B, 4B, 5B, 6B, 7B and 8B are cross-sectional views taken along the line A-A' of FIGS. 1A, 2A, 3A, 4A, 5A, 6A, 7A and 8A, respectively. FIGS. 2C and 3C are plan views illustrating photomasks used for exposure processes of FIGS. 2B and 3B, respectively.

Figure 1B:
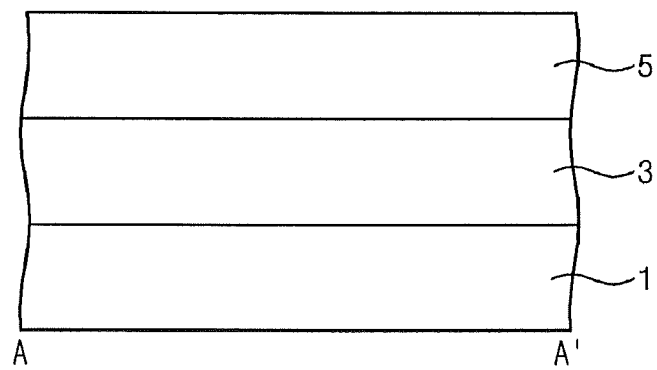
FIGS. 1B, 2B, 3B, 4B, 5B, 6B, 7B and 8B are cross-sectional views taken along the line A-A' of FIGS. 1A, 2A, 3A, 4A, 5A, 6A, 7A and 8A, respectively.

Referring to FIGS. 1A and 1B, an etch-target layer 3 may be formed on a substrate 1. The etch-target layer 3 may include one layer or more than 2 layers. The etch-target layer 3 may be an insulating layer, a conductive layer, or a mask layer serving as an etch mask. In some embodiments, a hydrocarbon layer may be used for the mask layer. A photoresist layer 5 may be formed on the etch-target layer 3. The photoresist layer 5 may be, for example, a negative type and thus an exposed portion the photoresist layer 5 may not be removed by a development solution. The photoresist layer 5 may be formed using coating and baking processes.

Figure 2A:
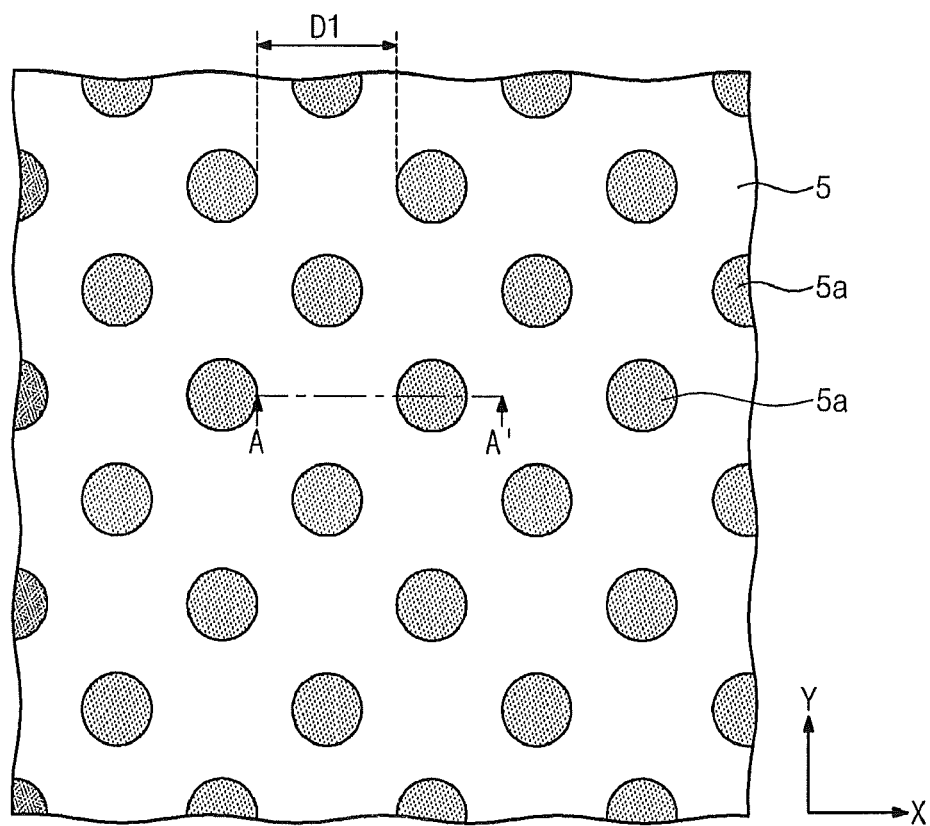
Figure 2B:
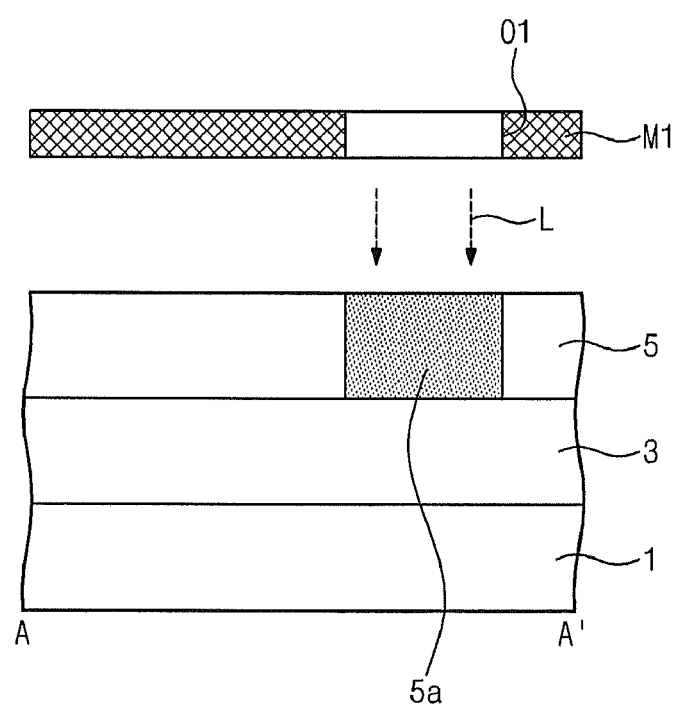
Figure 2C:
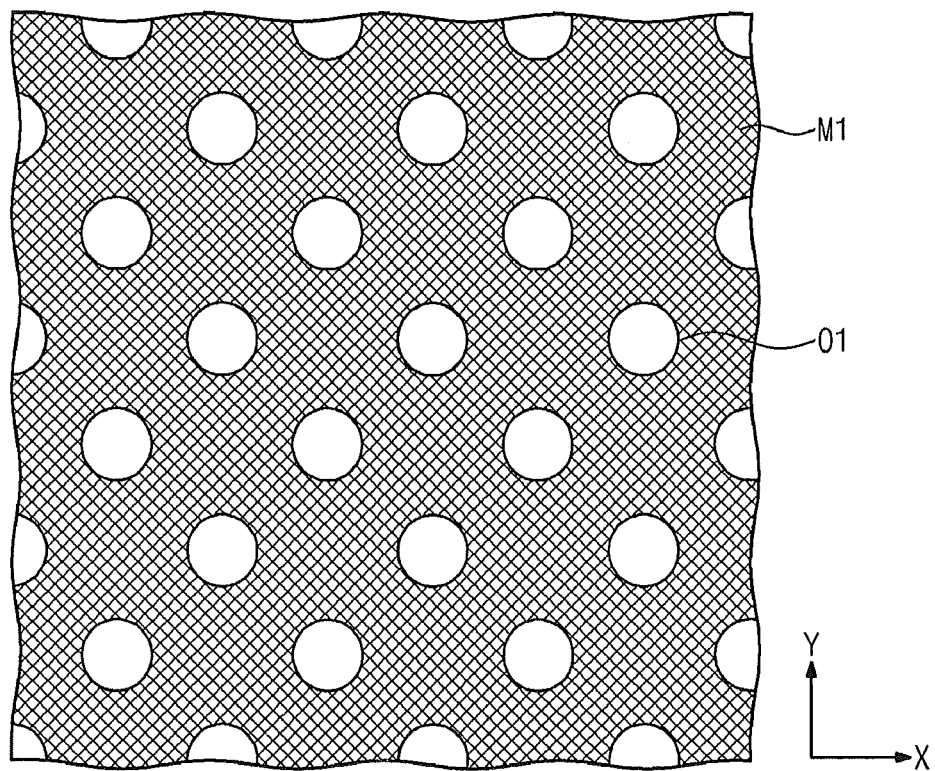
FIGS. 2C and 3C are plan views illustrating photomasks used for exposure processes of FIGS. 2B and 3B, respectively.

Referring to FIGS. 2A through 2C, a first exposure process may be performed on the photoresist layer 5, and first photoresist patterns 5a spaced apart from each other may be formed in the photoresist layer 5. Each of the first photoresist patterns 5a may have a circular pillar shape. The first photoresist patterns 5a may be arranged along a first direction X to be spaced apart from each other by a first distance D1. The first exposure process may be performed using a first photomask M1 of FIG. 2C. The first photomask M1 may include optically-transparent portions O1 spaced apart from each other by at least one light-blocking portion. Portions of the photoresist layer 5 exposed by light L passing through the optically-transparent portion O1 may be transformed into the first photoresist patterns 5a, which may not be removed by a developing solution.

Figure 3A:
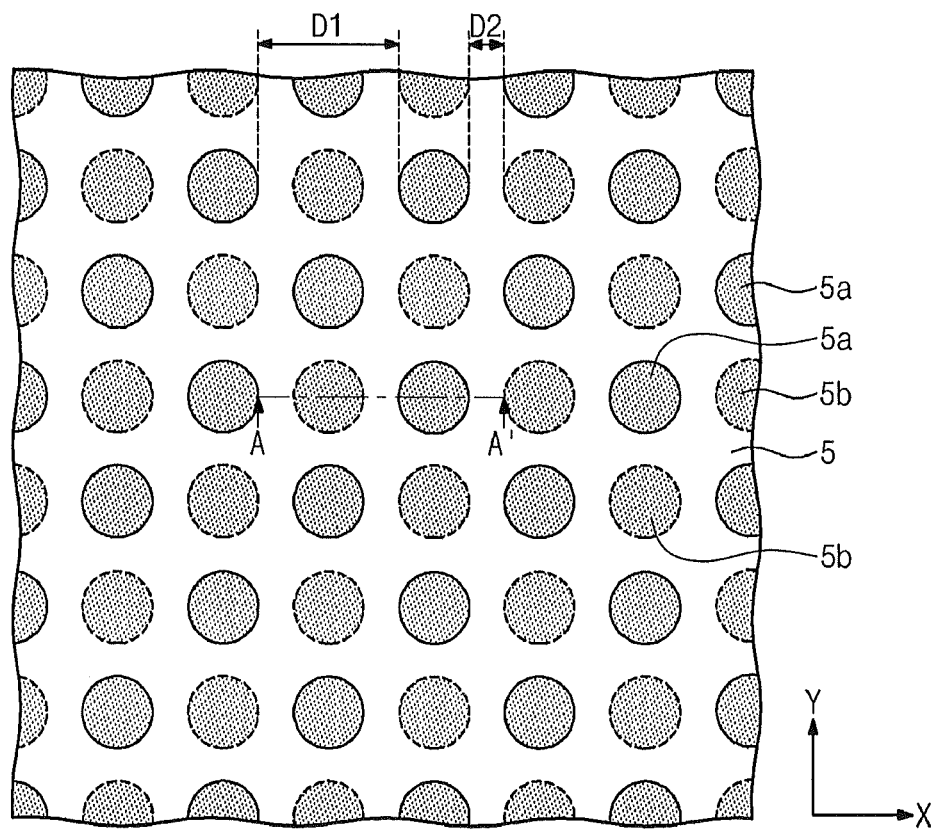
Figure 3B:
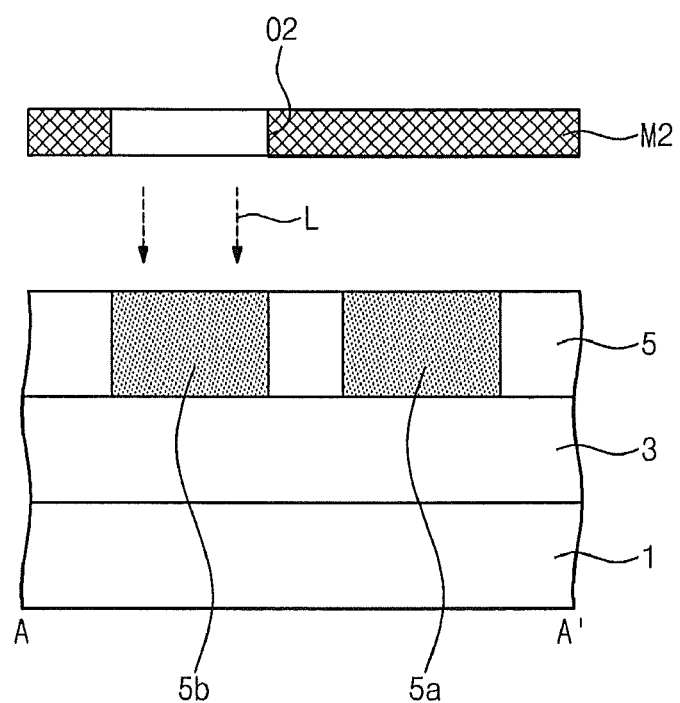
Figure 3C:
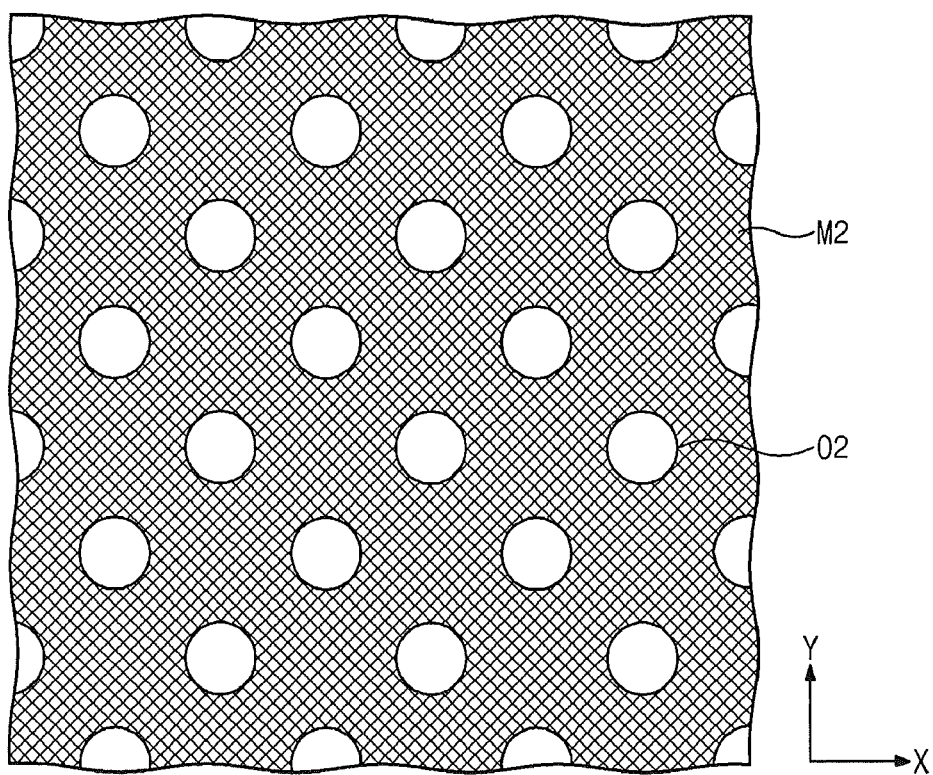

Referring to FIGS. 3A through 3C, a second exposure process may be performed on the photoresist layer 5 to transform other portions of the photoresist layer 5, which are not transformed into the first photoresist patterns 5a or are not exposed in the first exposure process, into second photoresist patterns 5b spaced apart from each other. The second photoresist patterns 5b may have a complementary arrangement with respect to the first photoresist patterns 5a. Accordingly, the second photoresist patterns 5b may be arranged spaced apart from each other by the first distance D1 along the first direction X and may be interposed between two directly adjacent ones of the first photoresist patterns 5a.

It will be understood that a pair of the first photoresist pattern 5a and a second photoresist pattern 5b interposed between the pair of the first photoresist pattern 5a may be arranged spaced from each other by a second distance D2. The second distance D2 may be smaller than the first distance D1. The second exposure process may be performed using a second photomask M2 of FIG. 3C. The second photomask M2 may include optically-transparent portions O2 spaced apart from each other by at least one light-blocking portion. The first and second photomasks M1 and M2 may be different photomasks. In some embodiments, the first and second photomasks M1 and M2 may be the same photomask. For example, the first photomask M1 may be moved along the first direction X by a predetermined distance after the first exposure process and then may be used in the second exposure process as the second photomask M2.

The first and second exposure processes may be performed using exposure process using ArF or KrF light source or using an immersion lithography technology. According to some embodiments of the present inventive concept, sub-40 nm patterns may be formed using ArF or KrF light source or using an immersion lithography technology. Further, methods of forming patterns according to some embodiments of the present inventive concept may be simple compared with the double patterning technology, and thus may thus be performed with an improved accuracy. It will be understood that one post exposure bake process may be performed after the first and second exposure processes.

Figure 4A:
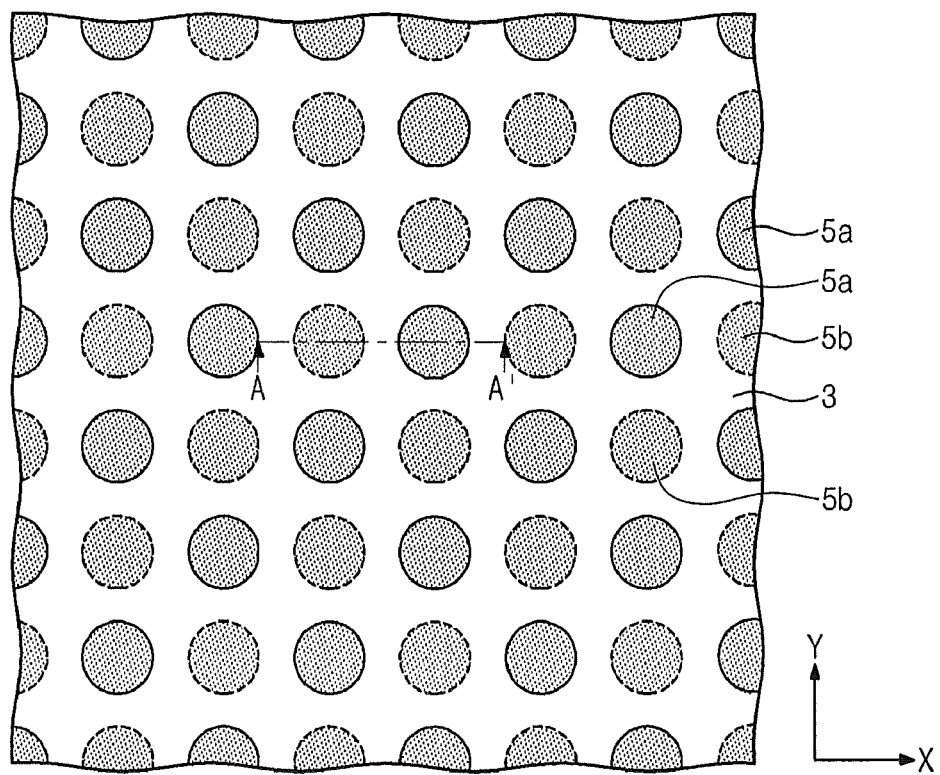
Figure 4B:
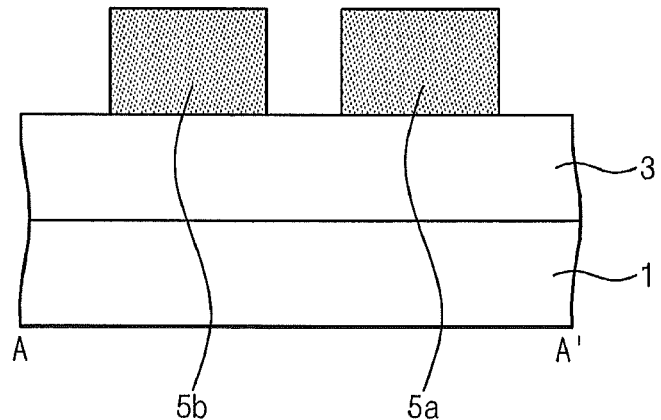

Referring to FIGS. 4A and 4B, a developing process may be performed to remove portions of the photoresist layer 5, which are not transformed into the first and second photoresist patterns 5a and 5b, and thereby expose a top surface of the etch-target layer 3.

Figure 5A:
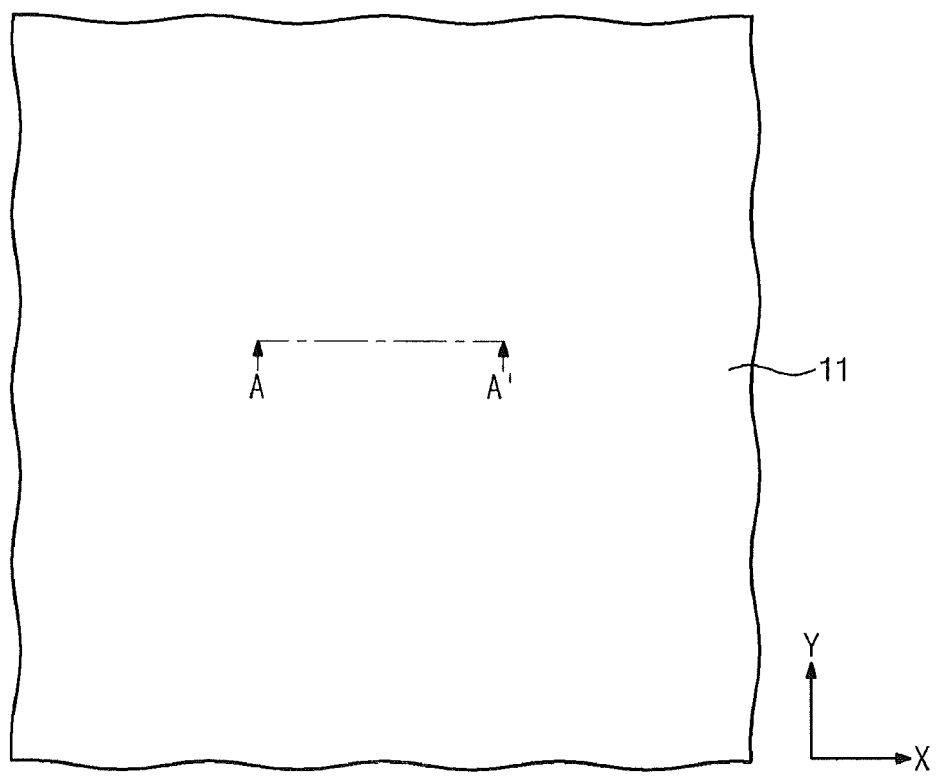
Figure 5B:
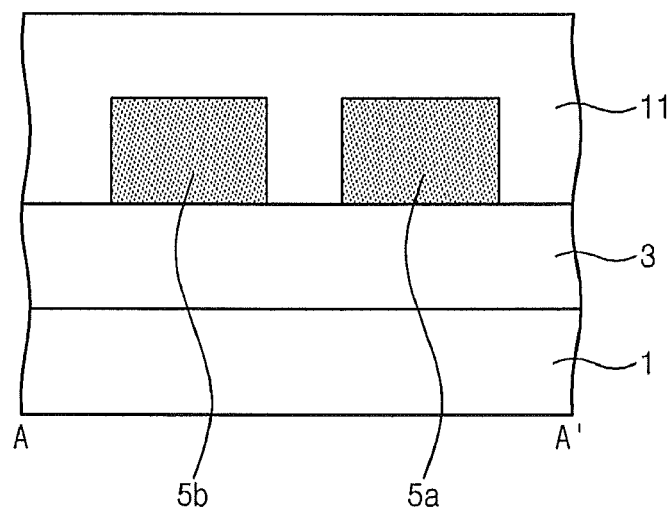

Referring to FIGS. 5A and 5B, a mask layer 11 may be formed on the substrate 1 in gaps between the first and second photoresist patterns 5a and 5b. The mask layer 11 may be formed of a material having an etch selectivity with respect to both the etch-target layer 3 and the first and second photoresist patterns 5a and 5b. For example, the mask layer 11 may be formed of an organic layer including silicon and/or metal. The mask layer 11 may be formed by, for example, a coating process.

Figure 6A:
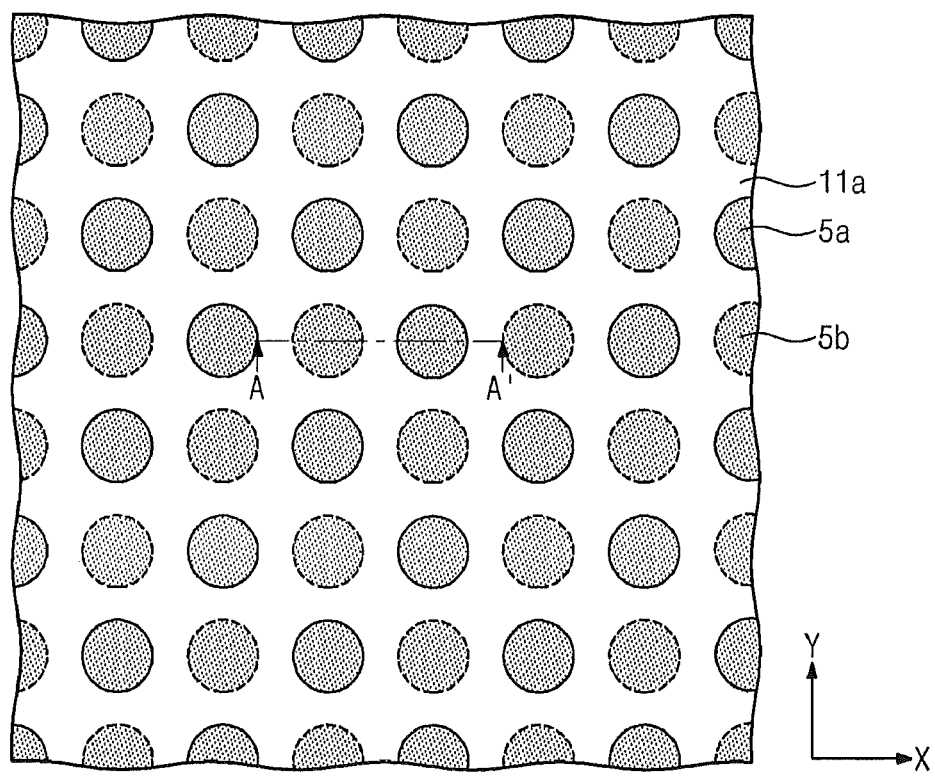
Figure 6B:
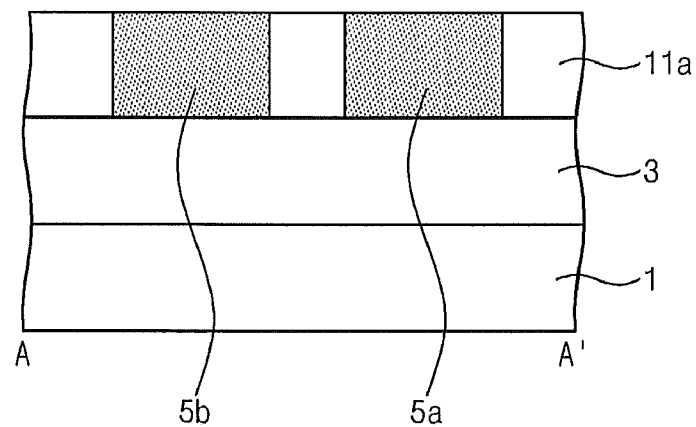

Referring to FIGS. 6A and 6B, a planarization process may be performed to the mask layer 11 to expose top surfaces of the first and second photoresist patterns 5a and 5b and may form a mask pattern 11a filling the gaps between the first and second photoresist patterns 5a and 5b. The planarization process may be performed using, for example, a chemical-mechanical polishing (CMP) or blanket etch-back process.

Figure 7A:
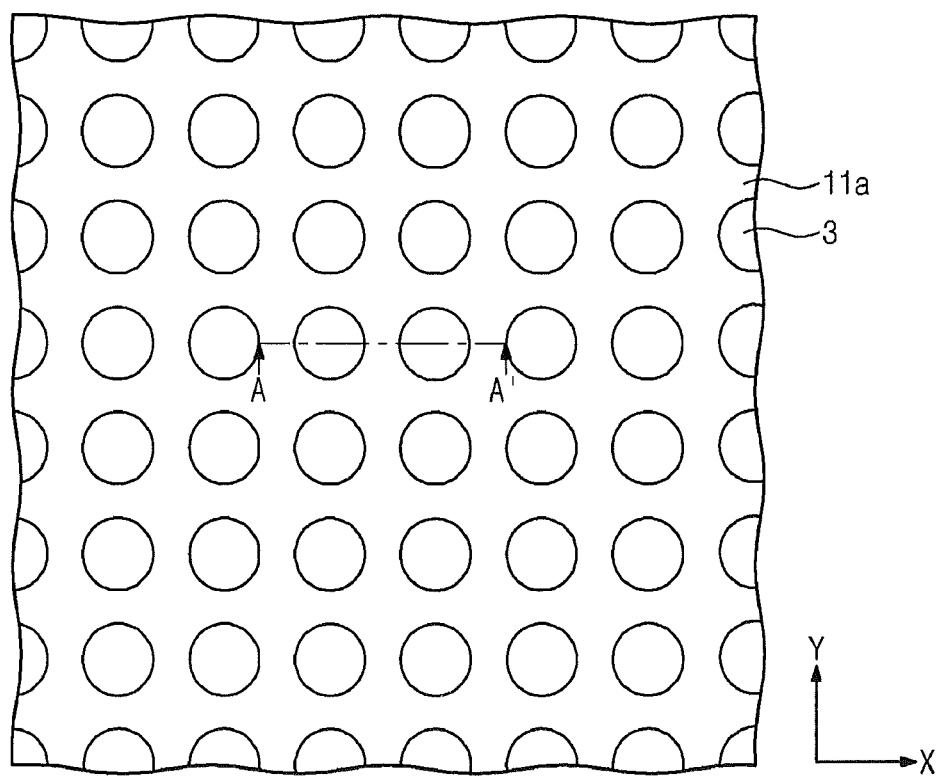
Figure 7B:
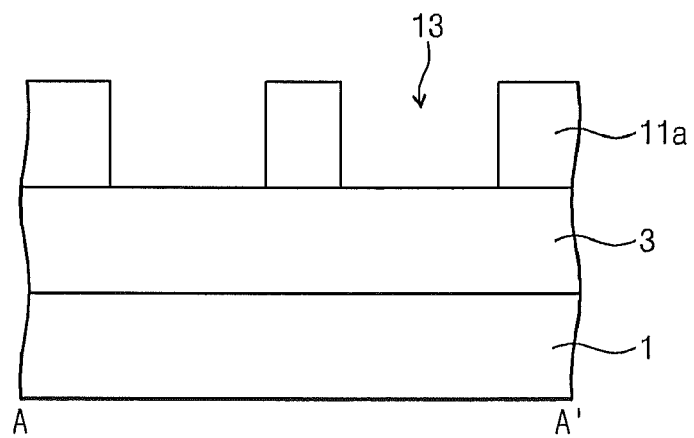

Referring to FIGS. 7A and 7B, the first and second photoresist patterns 5a and 5b may be selectively removed after the planarization process. For example, the first and second photoresist patterns 5a and 5b may be removed using a basic aqueous solution, for example, tetramethyl ammonium hydroxide (TMAH) or using an ashing process. The mask pattern 11a may include holes 13 formed where the first and second photoresist patterns 5a and 5b are removed.

Figure 8A:
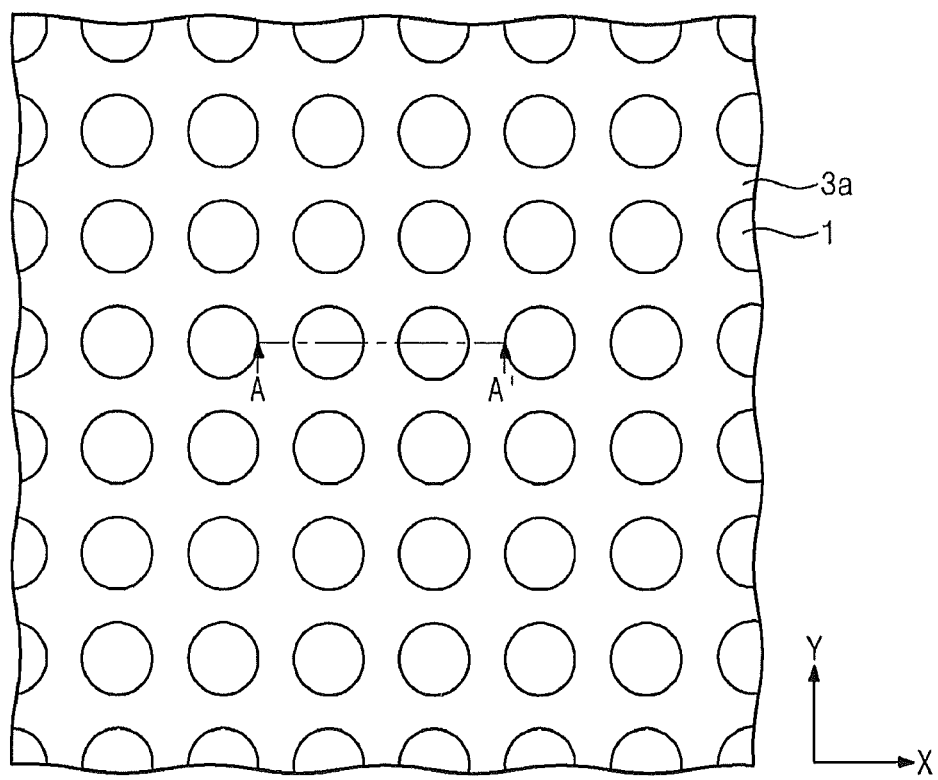
Figure 8B:
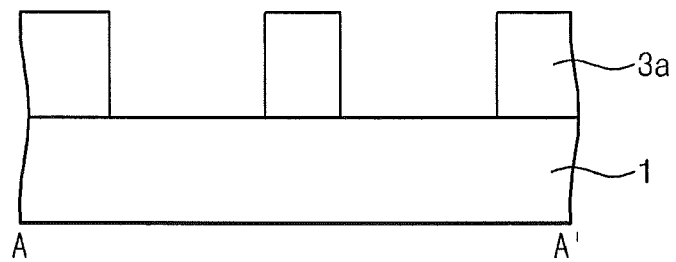

Referring to FIGS. 8A and 8B, the etch-target layer 3 may be patterned using the mask pattern 11a as an etch mask to form a target pattern 3a. In some embodiments, the target pattern 3a may be an interlayer insulating layer including holes.

Figure 9A:
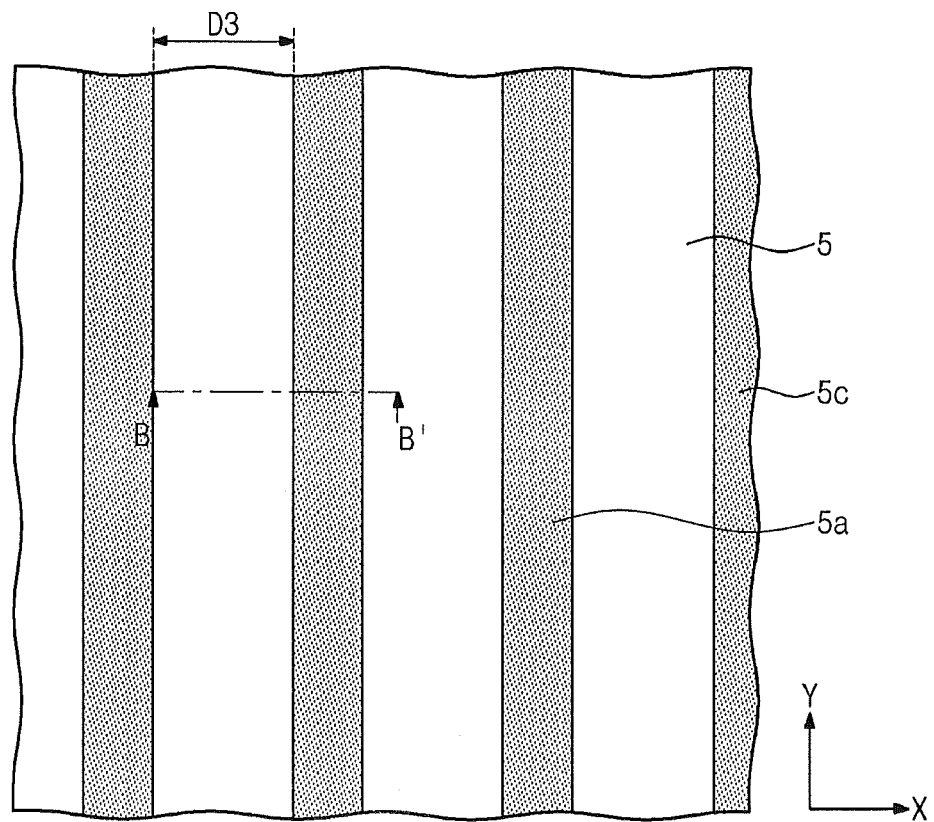
FIGS. 9A, 10A and 11A are plan views illustrating a method of forming patterns according to some embodiments of the present inventive concept.
Figure 9B:
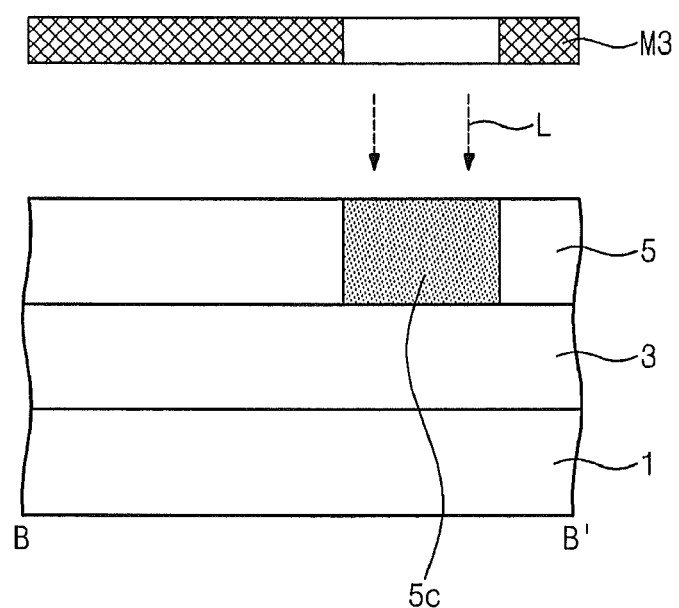
FIGS. 9B, 10B and 11B are cross-sectional views taken along the line B-B' of FIGS. 9A through 11A, respectively.
Figure 10A:
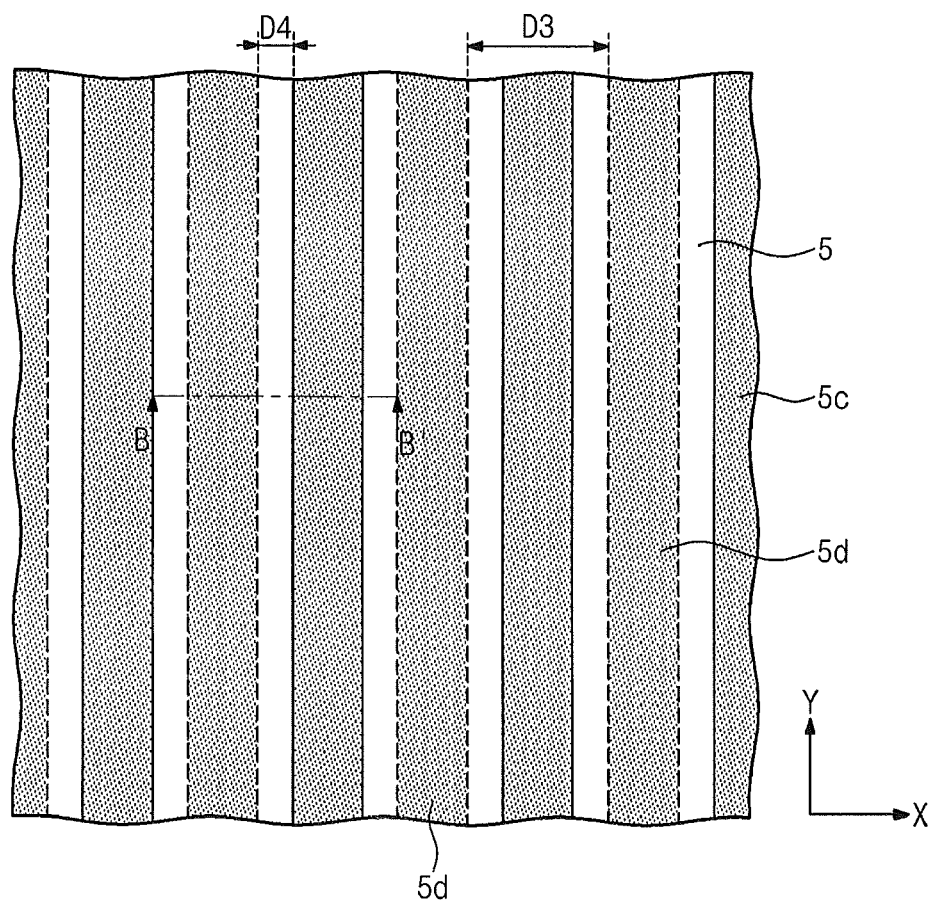
Figure 10B:
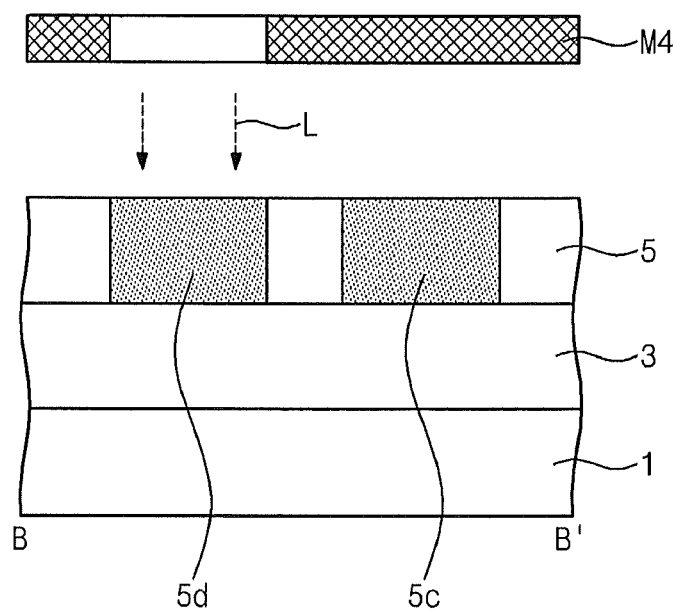
Figure 11A:
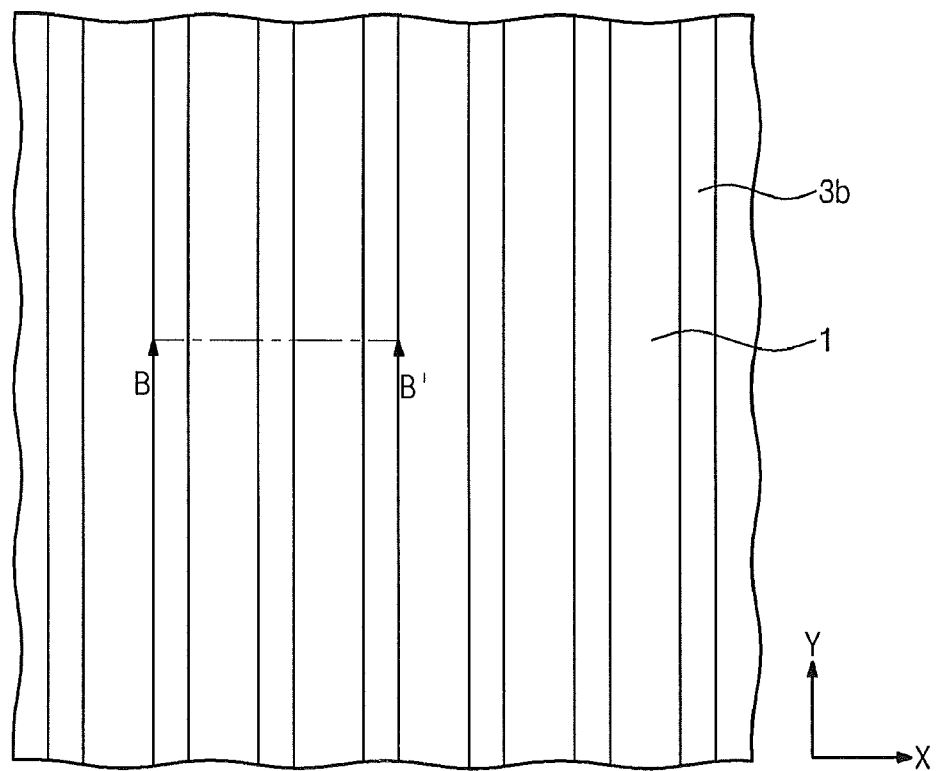
Figure 11B:
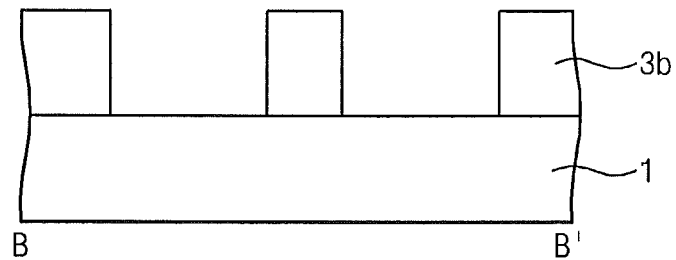
Figure 12A:
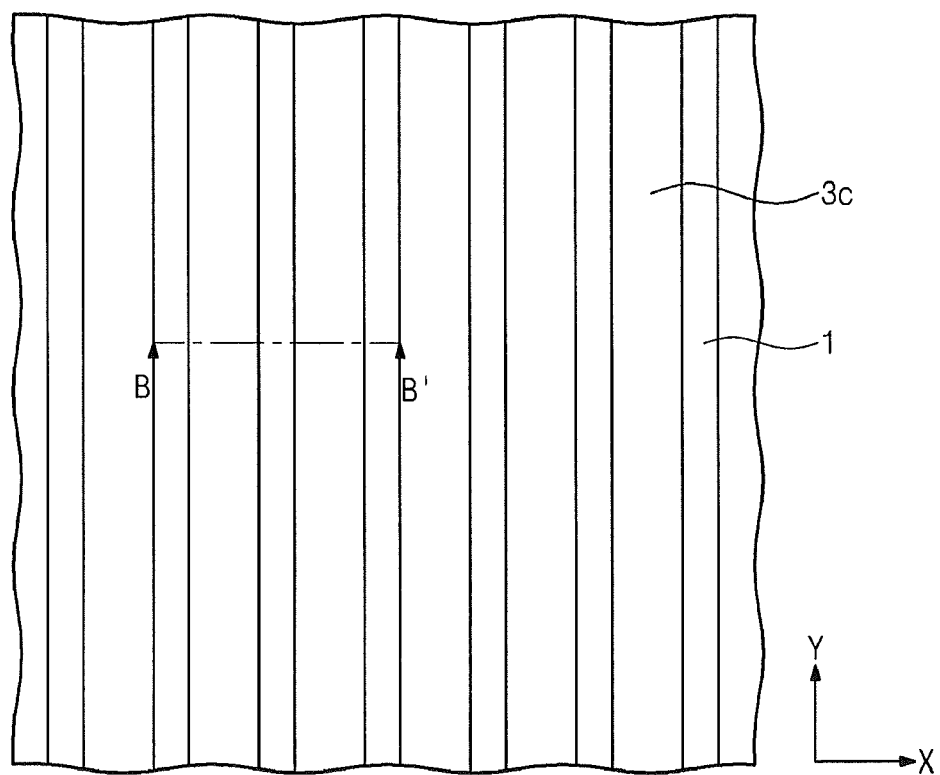
FIG. 12A is a plan view illustrating a method of forming patterns according to some embodiments of the present inventive concept.
Figure 12B:
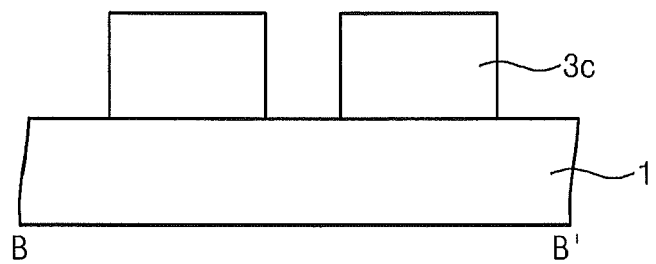
FIG. 12B is a cross-sectional view taken along the line B-B' of FIG. 12A.

FIGS. 9A, 10A and 11A are plan views illustrating a method of forming patterns according to some embodiments of the present inventive concept. FIGS. 9B, 10B and 11B are cross-sectional views taken along the line B-B' of FIGS. 9A through 11A, respectively. FIG. 12A is a plan view illustrating a method of forming patterns according to some embodiments of the present inventive concept. FIG. 12B is a cross-sectional view taken along the line B-B' of FIG. 12A.

Referring to FIGS. 9A and 9B, an etch-target layer 3 and a photoresist layer 5 may be sequentially formed on a substrate 1. A first exposure process may be performed to form third photoresist patterns 5c spaced apart from each other. Each of the third photoresist patterns 5c may have a line shape extending along a second direction Y. Two directly adjacent ones of the third photoresist patterns 5c may be spaced apart from each other by a third distance D3. The first exposure process may be performed using a third photomask M3 including optically-transparent portions having a line shape.

Referring to FIGS. 10A and 10B, a second exposure process may be performed to transform portions of the photoresist layer 5, which are not transformed into the third photoresist patterns 5c, into fourth photoresist patterns 5d spaced apart from each other. Each of the fourth photoresist patterns 5d may also have a line shape extending along the second direction Y. The fourth photoresist patterns 5d may have a complementary arrangement with respect to the third photoresist patterns 5c along the first direction X. The fourth photoresist patterns 5d may be arranged spaced apart from each other along the first direction X by the third distance D3. Each of the fourth photoresist patterns 5d may be interposed between two directly adjacent ones of the third photoresist patterns 5c. For example, a pair of the third photoresist patterns 5c and a fourth photoresist pattern 5d interposed between the pair of the third photoresist patterns 5c may be arranged spaced from each other by a fourth distance D4. The fourth distance D4 may be smaller than the third distance D3.

The second exposure process may be performed using a fourth photomask M4 including optically-transparent portions having a line shape. The third and fourth photomasks M3 and M4 may be different photomasks. In some embodiments, the third photomask M3 may be used as the fourth photmask M4 in the second exposure process. The third photomask M3 may be moved before the second exposure process.

Referring to FIGS. 11A and 11B, portions of the photoresist layer 5 not transformed into the first and second photoresist patterns 5c and 5d may be removed to expose a top surface of the etch-target layer 3. As described with reference to FIGS. 5A through 7A and FIGS. 5B through 7B, a mask layer may be formed on the etch-target layer 3 and then may be etched to form mask patterns in gaps between the third and fourth photoresist patterns 5c and 5d. The third and fourth photoresist patterns 5c and 5d may be selectively remove, and then the etch-target layer 3 may be etched using the mask patterns as an etch mask to form a target pattern 3b.

According to FIGS. 12A and 12B, in some embodiments, portions of the photoresist layer 5 not transformed into the first and second photoresist patterns 5c and 5d may be removed to expose the top surface of the etch-target layer 3. Thereafter, the etch-target layer 3 may be etched using the third and fourth photoresist patterns 5c and 5d as an etch mask to form a target pattern 3c. Accordingly, forming the target pattern 3c may not include forming mask patterns including, for example, metal-containing organic material. It will be understood that the target pattern 3c may have a shape opposite to a shape of the target pattern 3b of FIG. 11B.

Figure 13A:
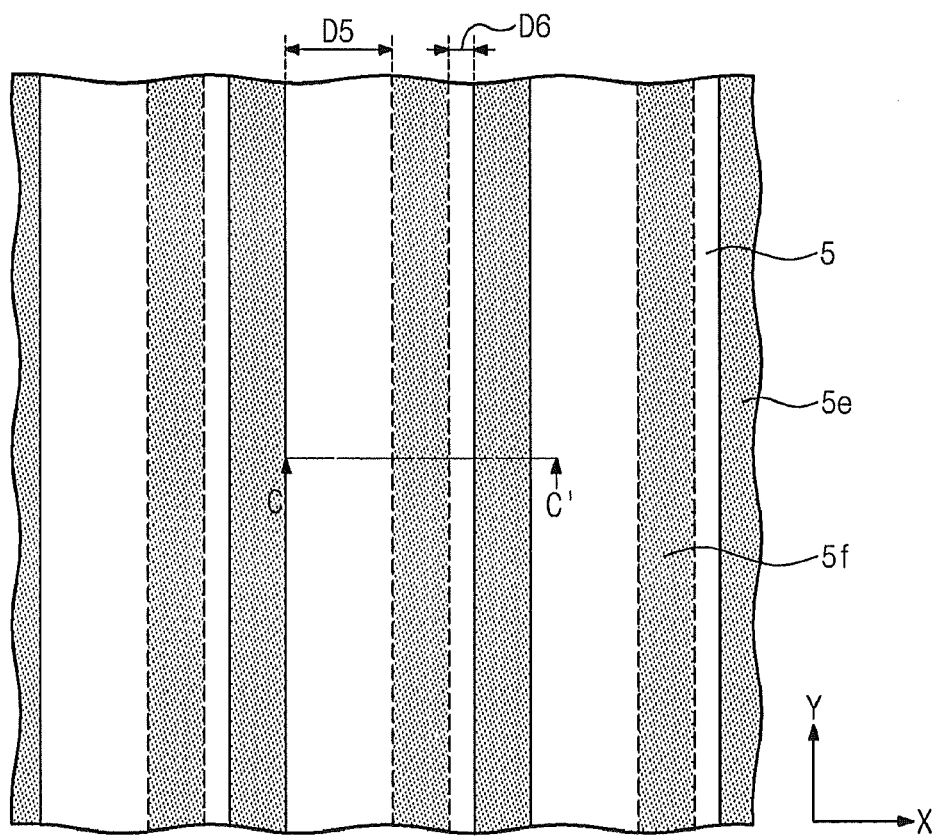
FIGS. 13A and 14A are plan views illustrating a method of forming patterns according to some embodiments of the present inventive concept.
Figure 13B:
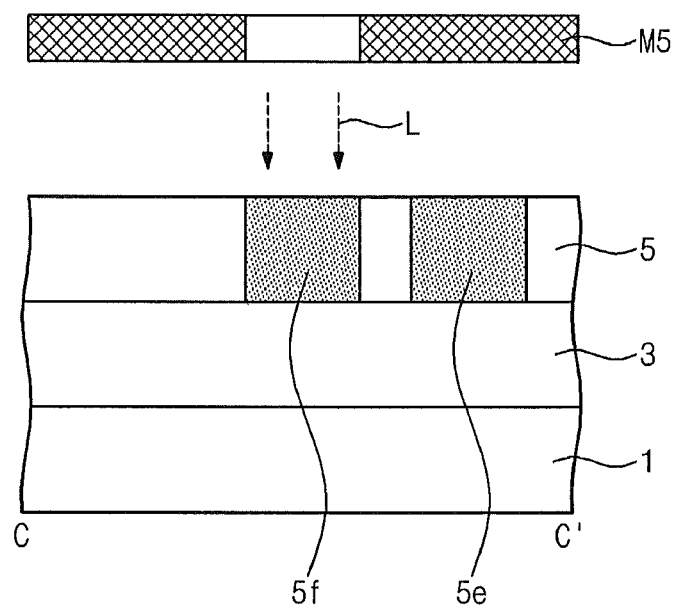
FIGS. 13B and 14B are cross-sectional views taken along the line C-C' of FIGS. 13A and 14A, respectively.
Figure 14A:
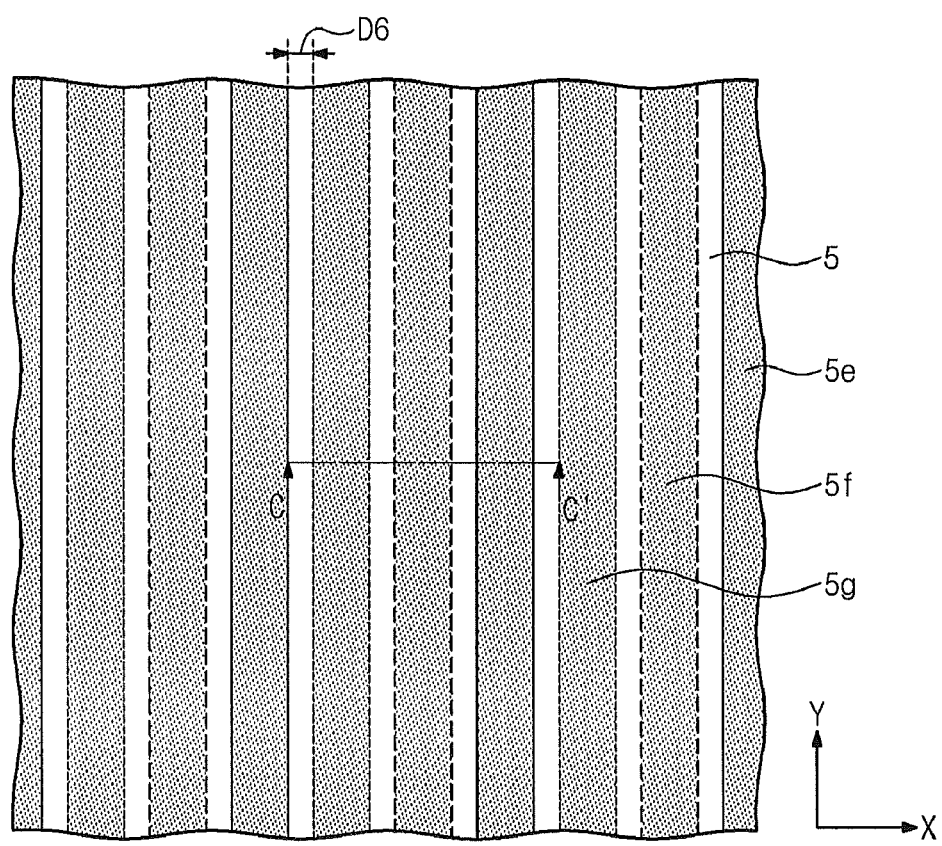
Figure 14B:
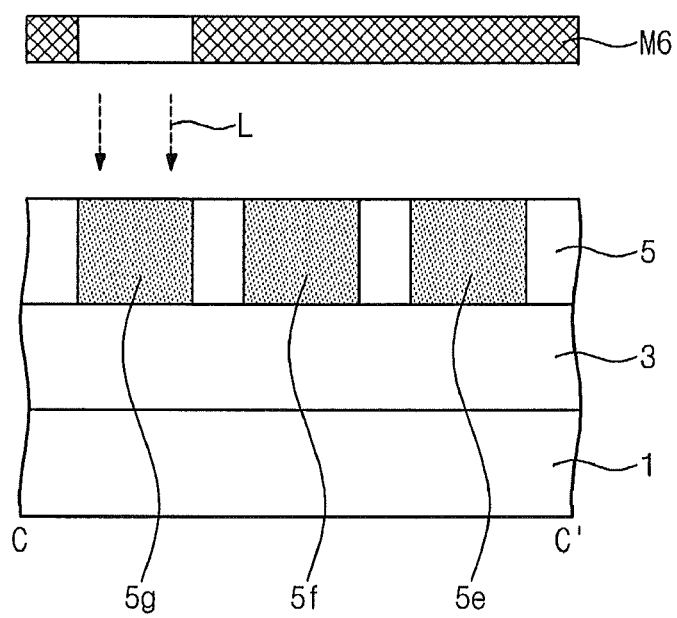

FIGS. 13A and 14A are plan views illustrating a method of forming patterns according to some embodiments of the present inventive concept. FIGS. 13B and 14B are cross-sectional views taken along the line C-C' of FIGS. 13A and 14A, respectively.

Referring to FIGS. 13A and 13B, the etch-target layer 3 and the photoresist layer 5 may be sequentially formed on the substrate 1. A first exposure process may be performed to form fifth photoresist patterns 5e extending along the second direction Y and spaced apart from each other in the first direction X. A second exposure process may be performed to form sixth photoresist patterns 5f extending along the second direction Y and spaced apart from each other in the first direction X. The second exposure process may be performed using a fifth photomask M5 of FIG. 13B.

In some embodiments, the first and second exposure processes may use different photomasks. In some embodiments, the first and second exposure process may use one photomask and the photomask may be moved after the first exposure process. Specifically, after the first exposure process, the photomask may be moved along the first direction X by a predetermined distance to be used in the second exposure process. Each of the six photoresist patterns 5f may be positioned between two directly adjacent ones of the fifth photoresist patterns 5e. In some embodiments, the sixth photoresist pattern 5f may be not equidistant from the two adjacent ones of the fifth photoresist patterns 5e. Accordingly, a fifth distance D5 between one of the two directly adjacent ones of the fifth photoresist patterns 5e and the sixth photoresist pattern 5f may be greater than a sixth distance D6 between another of the two directly adjacent ones of the fifth photoresist patterns 5e and the sixth photoresist pattern 5f.

Referring to FIGS. 14A and 14B, a third exposure process may be performed to transform portions of the photoresist layer 5, which are not transformed into the fifth and sixth photoresist patterns 5e and 5f, into seventh photoresist patterns 5g that are spaced apart from each other. Each of the seventh photoresist patterns 5g may have a line shape extending along the second direction Y. Each of the seventh photoresist patterns 5g may be disposed between one of the fifth photoresist patterns 5e and one of the sixth photoresist pattern 5f. The third exposure process may be performed using a sixth photomask M6 of FIG. 14B including a line-shaped optically-transparent portion. The fifth and sixth photomasks M5 and M6 may be different photomasks. In some embodiments, the fifth photomask M5 may be moved after the second exposure process to be used as the sixth photomask M6 in the third exposure process.

As described with reference to FIGS. 11A and 11B, remaining portions of the photoresist layer 5 not transformed into the fifth to seventh photoresist patterns 5e, 5f, and 5g may be removed. Mask patterns may be formed in gaps the fifth to seventh photoresist patterns 5e, 5f, and 5g and then the fifth to seventh photoresist patterns 5e, 5f, and 5g may be selectively removed. The etch-target layer 3 may be etched using the mask patterns as an etch mask.

Alternatively, as described with reference to FIGS. 12A and 12B, remaining portions of the photoresist layer 5 not transformed into the fifth to seventh photoresist patterns 5e, 5f, and 5g may be removed. The etch-target layer 3 may be etched using the fifth to seventh photoresist patterns 5e, 5f, and 5g as an etch mask. In will be understood that exposure processes may be performed more than three times to reduce distances between the photoresist patterns.

Figure 15:
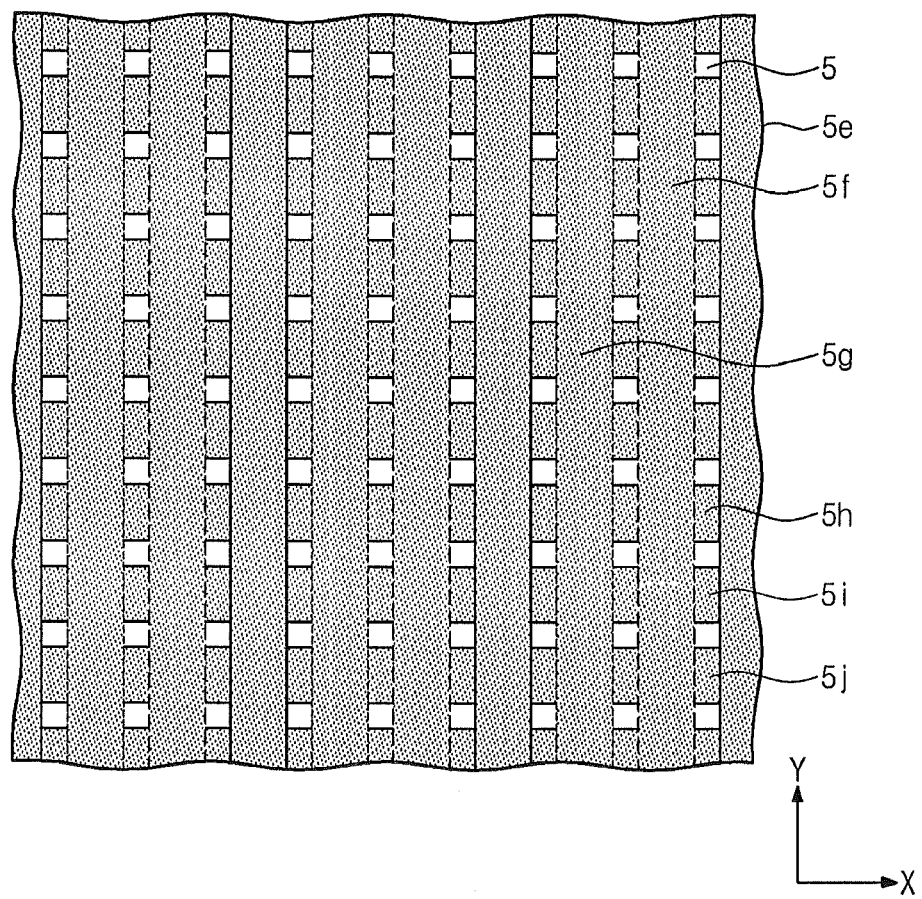
FIG. 15 is a plan view illustrating a method of forming patterns according to some embodiments of the present inventive concept.

FIG. 15 is a plan view illustrating a method of forming patterns according to some embodiments of the present inventive concept. Referring to FIG. 15, the fifth to seventh photoresist patterns 5e, 5f, and 5g may be formed in the photoresist layer 5 and each of the fifth to seventh photoresist patterns 5e, 5f, and 5g may have a line shape extending along the second direction Y. Additional exposure processes may be performed to form eighth, ninth, and tenth photoresist patterns 5h, 5i, and 5j. Each of the eighth, ninth, and tenth photoresist patterns 5h, 5i, and 5j has a line shape extending along the first direction X. Photomasks for the additional exposure processes may have a line-shaped optically-transparent portions extending along the first direction X.

It will be understood that the additional exposure processes may expose portions of the fifth to seventh photoresist patterns 5e, 5f, and 5g but may not change properties of the fifth to seventh photoresist patterns 5e, 5f, and 5g significantly because the fifth to seventh photoresist patterns 5e, 5f, and 5g have been exposed before the additional exposure processes. The additional exposure processes may transform portions of the photoresist layer 5 into the eighth, ninth, and tenth photoresist patterns 5h, 5i, and 5j and may leave portions of the photoresist layer 5 not transformed in the fifth to tenth photoresist patterns 5e, 5f, 5g, 5h, 5i and 5j. Each of the portions of the photoresist layer 5 may have an island shape. The portions of the photoresist layer 5 may be selectively removed, and the etch-target layer 3 may be etched using the fifth to tenth photoresist patterns 5e, 5f, 5g, 5h, 5i and 5j as an etch mask.

Figure 16:
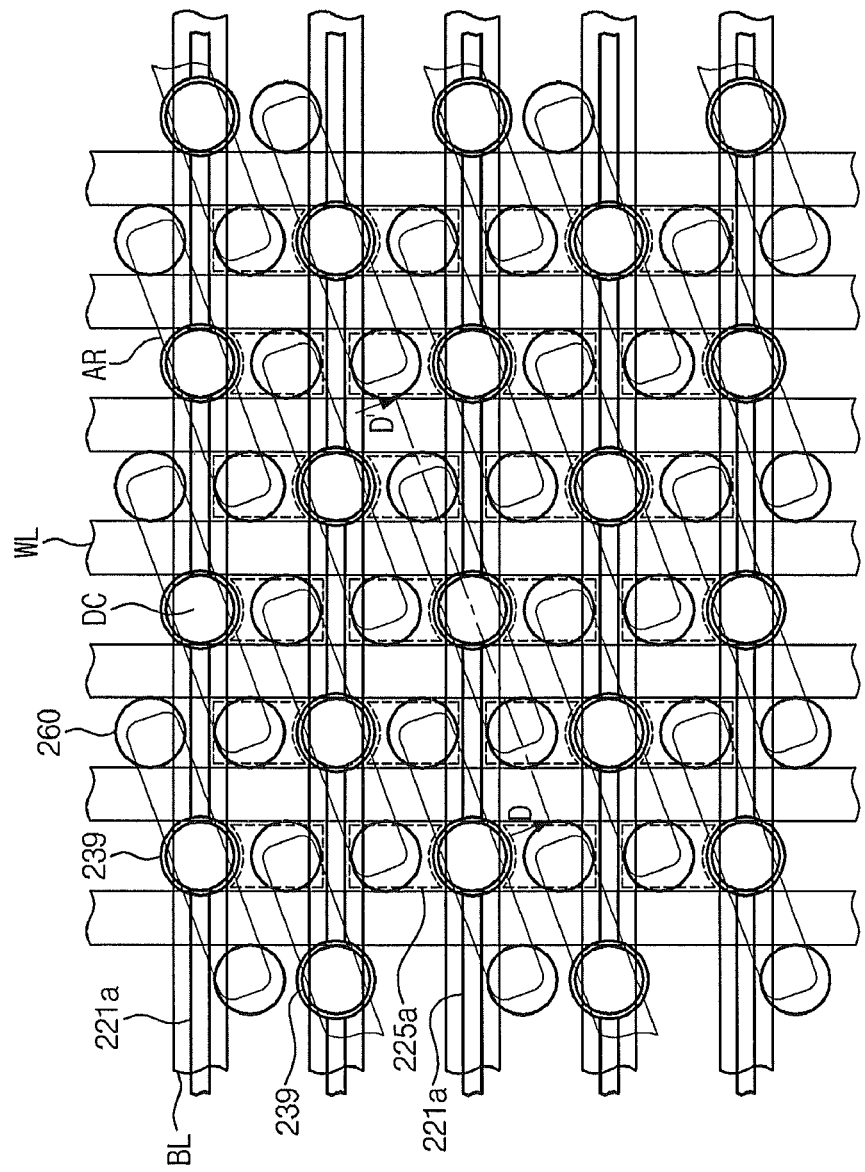
FIG. 16 is a plan view of a Dynamic random-access memory (DRAM) device formed using a method of forming patterns according to some embodiments of the present inventive concept.
Figure 17:
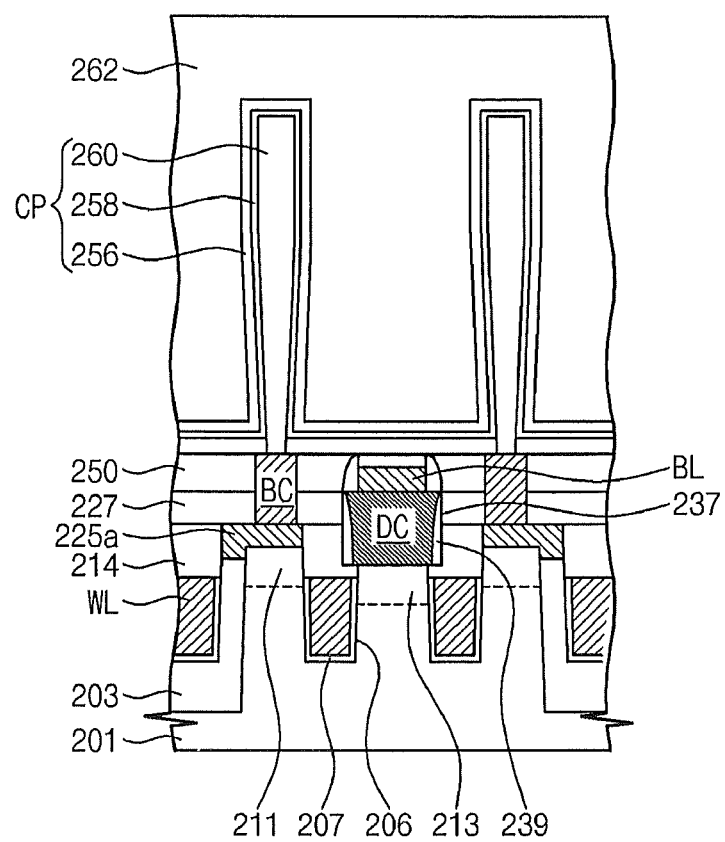
FIG. 17 is a cross-sectional view taken along the line D-D' of FIG. 16.

Patterning methods according to some embodiments of the present inventive concept may be applied to fabricate Dynamic random-access memory (DRAM) devices, for example, as illustrated in FIGS. 16 and 17. FIG. 16 is a plan view of a Dynamic random-access memory (DRAM) device formed using a method of forming patterns according to some embodiments of the present inventive concept. FIG. 17 is a cross-sectional view taken along the line D-D' of FIG. 16.

Referring to FIGS. 16 and 17, in the DRAM device, device isolation layers 203 may be provided in a substrate 201 to define active regions AR. Word lines WL may be provided in the substrate 201 and each of the word lines WL crosses over the active regions AR and the device isolation layers 203. For example, the word lines WL may be disposed in grooves 206, respectively, which may be formed on the substrate 201. Each of the word lines WL may have a top surface lower than a top surface of the substrate 201. A gate insulating layer 207 may be interposed between the word lines WL and the substrate 201. A first doped region 211 may be provided in a portion of the substrate 201 at one side of the word line WL, and a second doped region 213 may be provided in a portion of the substrate 201 at another side of the word line WL.

First capping layer patterns 214 may be provided on the respective word lines WL. Each of storage node pads 225a may be provided between a pair of the capping layer patterns 214 adjacent to each other to be in contact with the first doped region 211. Further, a separation pattern 221a may be provided between a pair of the capping layer patterns 214 adjacent to each other and between the storage node pads 225a adjacent to each other to be in contact with the device isolation layer 203.

A first insulating layer 227 may be provided on the substrate 201 and bit lines BL may be provided on the first insulating layer 227. The bit lines BL may be electrically connected to the second doped regions 213, respectively, through bit line node contacts DC. The bit line node contacts DC may be provided in bit line node holes 237, respectively, which are formed through the first insulating layer 227, in the first capping layer pattern 214, and in the substrate 201.

A sidewall of each of the bit line node holes 237 may be covered with an insulating spacer 239. A second insulating layer 250 may be provided on the first insulating layer 227. Storage node contacts BC may be provided through the second insulating layer 250 and the first insulating layer 227 to be in contact with the storage node pads 225a, respectively. Lower electrodes 260 may be provided on the second insulating layer 250 to be in contact with the storage node contacts BC, respectively. Top and side surfaces of the lower electrodes 260 may be conformally covered with a dielectric 258. The dielectric 258 may include a metal oxide layer having a high dielectric constant. The dielectric 258 may be conformally covered with an upper electrode layer 256. The lower electrode 260, the dielectric 258, and the upper electrode layer 256 may constitute a capacitor CP. The upper electrode layer 256 may be covered with a plate electrode layer 262.

The holes for the storage node contact BC, the bit line node holes 237, and the holes for the lower electrodes 260 may be formed using patterning methods according to some embodiments of the present inventive concept. The word lines WL and the bit lines BL may also be formed using patterning methods according to some embodiments of the present inventive concept.

Figure 18:
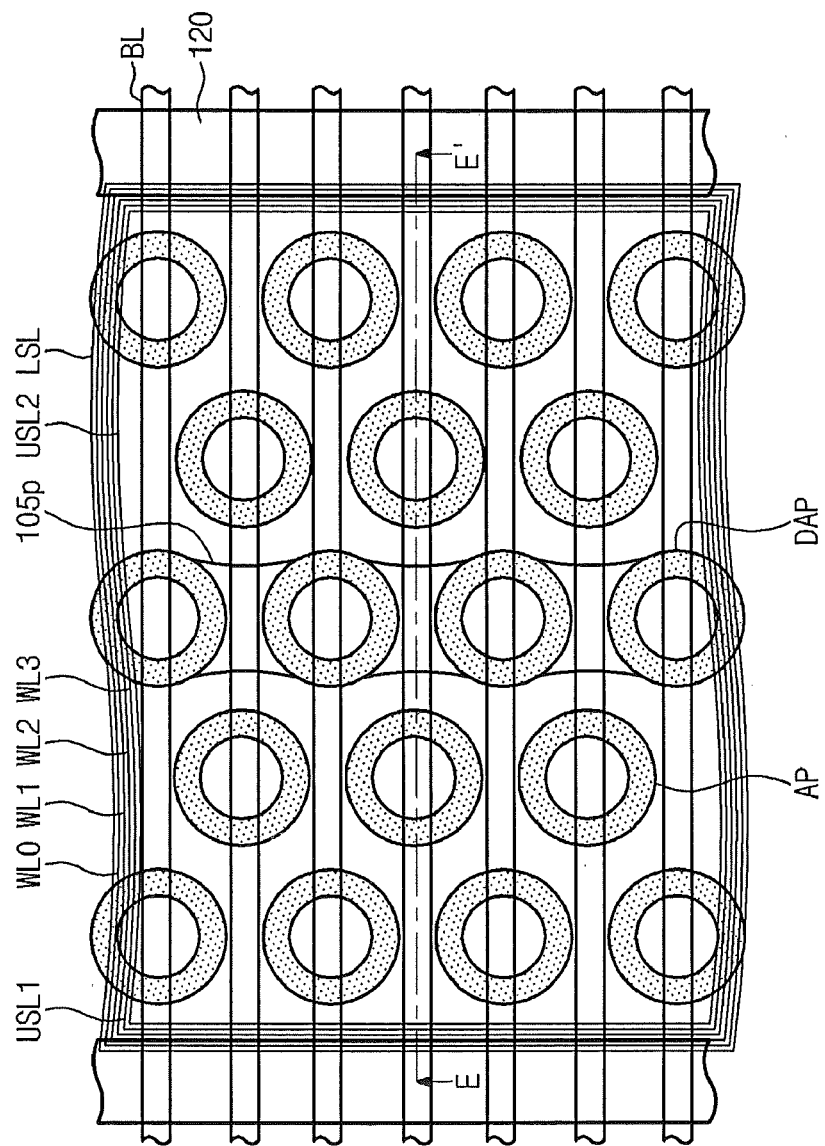
FIG. 18 is a plan view of a vertical non-volatile memory device formed using a method of forming patterns according to some embodiments of the present inventive concept.
Figure 19:
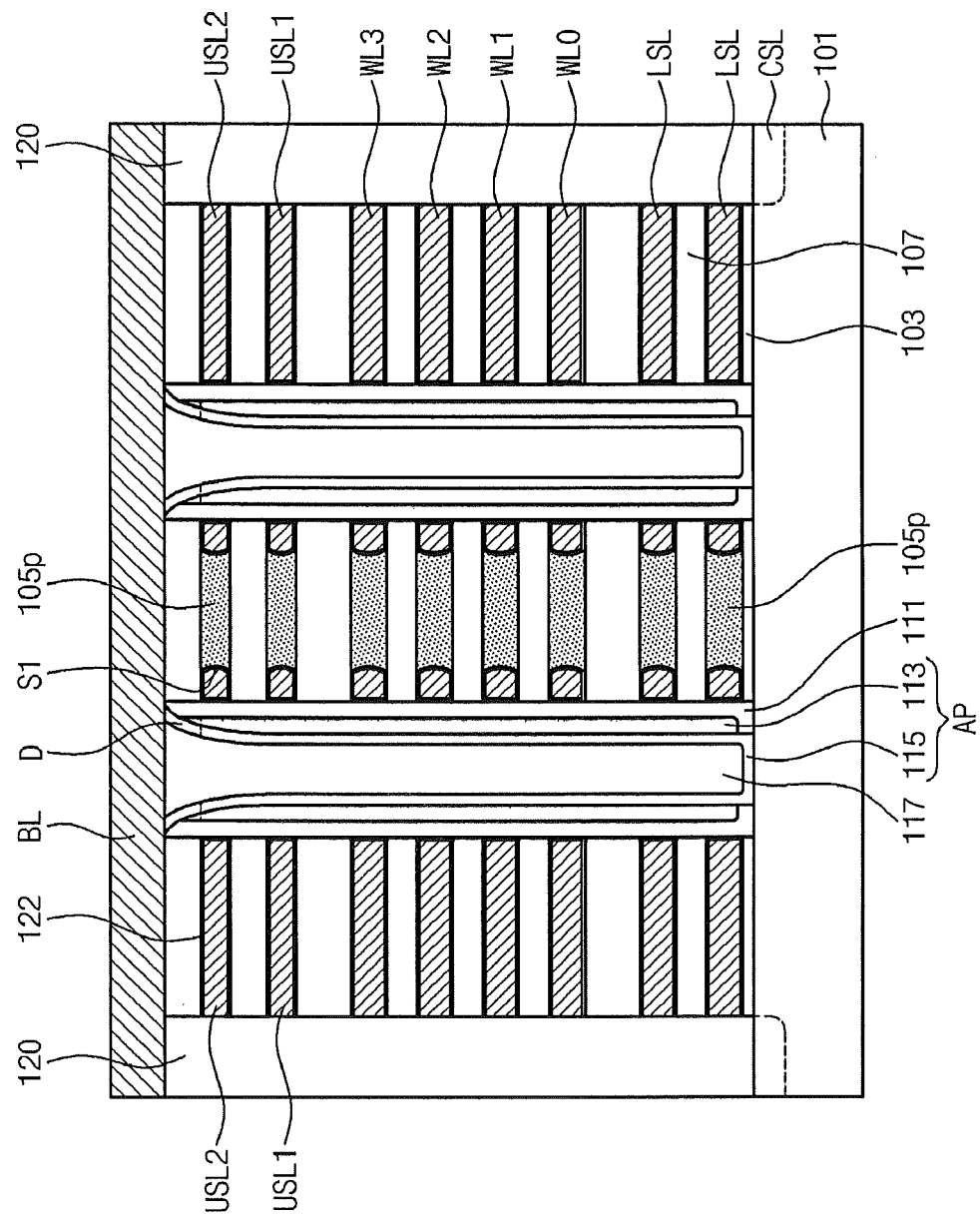
FIG. 19 is a cross-sectional view taken along the line E-E' of FIG. 18.

Patterning methods according to some embodiments of the present inventive concept may be applied to fabricate vertical non-volatile memory devices, for example, as illustrated in FIGS. 18 and 19. FIG. 18 is a plan view of a vertical non-volatile memory device formed using a method of forming patterns according to some embodiments of the present inventive concept. FIG. 19 is a cross-sectional view taken along the line E-E' of FIG. 18.

Referring to FIGS. 18 and 19, the vertical non-volatile memory device may include common source lines CSL provided on or in the substrate 101, and lower selection lines LSL, word lines WL0-WL3, upper selection lines USL1 and USL2, and bit lines BL that are stacked on the substrate 101. Active patterns AP may extend upward from the substrate 101 to be connected to the bit lines BL. Each of the active patterns AP may be formed to penetrate the upper selection lines USL1 and USL2, the lower selection lines LSL, and the word lines WL0-WL3.

A gate insulating layer 111 may be provided between the lines USL, LSL, and WL and the active patterns AP and may include at least one or all of a tunnel insulating layer, a charge trap layer and a blocking insulating layer. In some embodiments, the charge trap layer may not be provided between the lower selection line LSL and the active pattern AP or between the upper selection lines USL1 and USL2 and the active pattern AP. A high-k dielectric 122 may be provided between the gate insulating layer 111 and the lines USL, LSL, and WL. A common drain region D may be provided on or in an upper portion of the active pattern AP. The high-k dielectric 122 may include the blocking layer.

The active pattern AP may include a first active layer 113 and a second active layer 115. The active layers 113 and 115 may be formed of a semiconductor layer, for example, an undoped polysilicon layer. The first active layer 113 may have a spacer shape. The second active layer 115 may be in contact with both of the first active layer 113 and the substrate 101. The active pattern AP may have a cup shape. An internal space of the active pattern AP may be filled with a first insulating gap-fill pattern 117.

The upper selection lines USL1 and USL2 may be provided to have a double layered structure, and the lower selection lines LSL may also be provided to have a double layered structure.

A buffer oxide layer 103 may be provided on the substrate 101. A gate interlayer insulating layer 107 may be provided on a top surface of the upper selection lines USL1 and USL2, between the upper selection lines USL1 and USL2 and the word line WL3, between the word lines WL0-WL3, and between the word line WL0 and the lower selection lines LSL. A second insulating gap-fill pattern 120 may be provided between the upper selection lines USL1 and USL2 to separate them from each other. The second insulating gap-fill pattern 120 may extend vertically and thereby separate the word lines WL0-WL3 horizontally from each other and the lower selection lines LSL horizontally from each other.

A sacrificial layer pattern 105p may be provided spaced apart from the insulating gap-fill pattern 120. In some embodiments, the sacrificial layer pattern 105p may penetrate the upper selection lines USL1 and USL2 and may extend between the lines LSL and WL. The sacrificial layer pattern 105p may be formed of a material having a different etch rate from that of the gate interlayer insulating layer 107. A dummy active pattern DAP may be provided between the upper selection lines USL1 and USL2 to be in contact with the sacrificial layer pattern 105p. Although the dummy active pattern DAP has the same shape as the active pattern AP, it may not serve as an active layer. The dummy active pattern DAP may contribute to reduce a stress applied to other patterns adjacent thereto.

The holes for the active pattern AP and the dummy active pattern DAP may be formed using patterning methods according to some embodiments of the present inventive concept. The bit lines BL may also be formed using patterning methods according to some embodiments of the present inventive concept.

Figure 20:
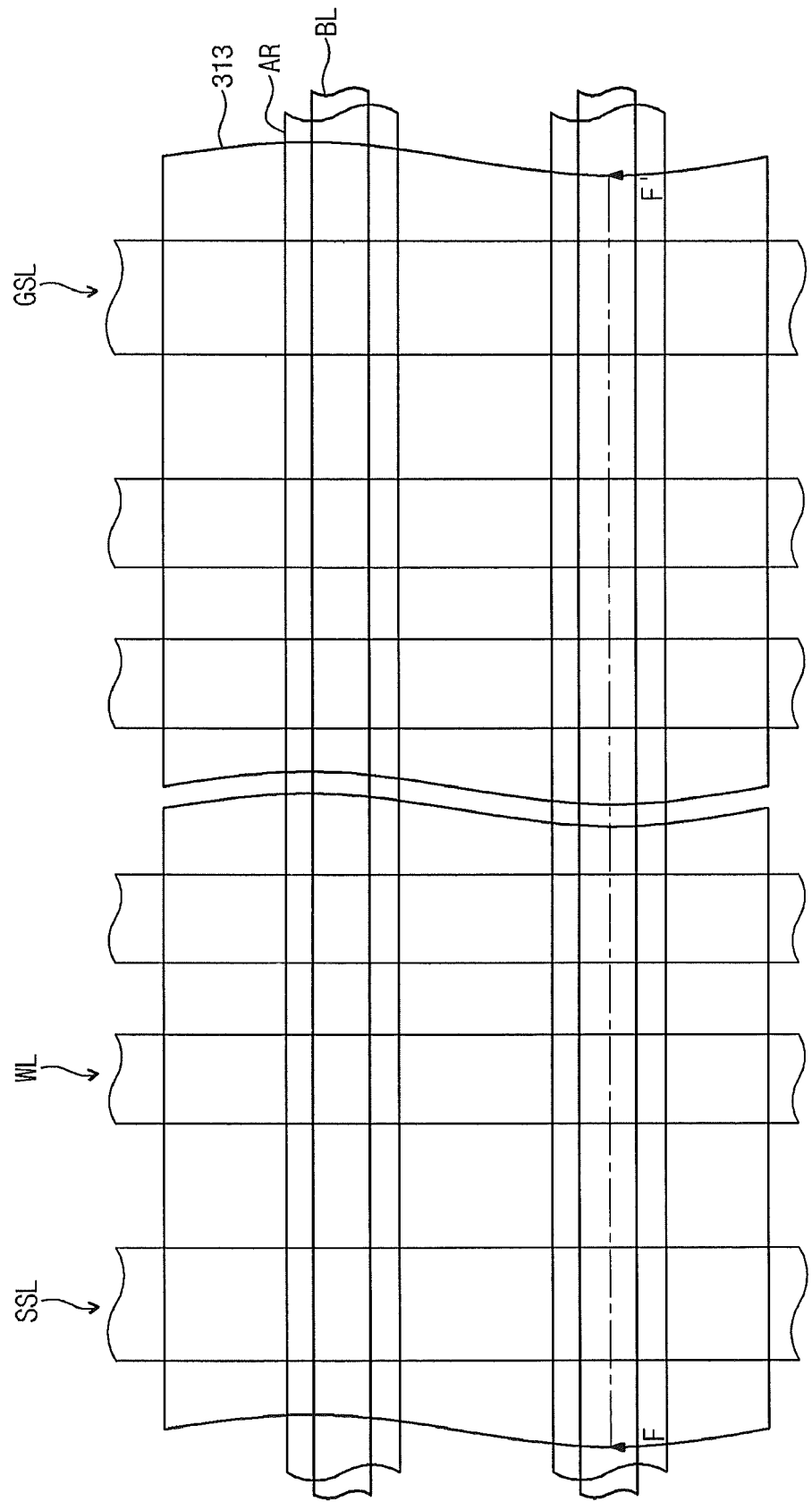
FIG. 20 is a plan view of a non-volatile memory device formed using a method of forming patterns according to some embodiments of the present inventive concept.
Figure 21:
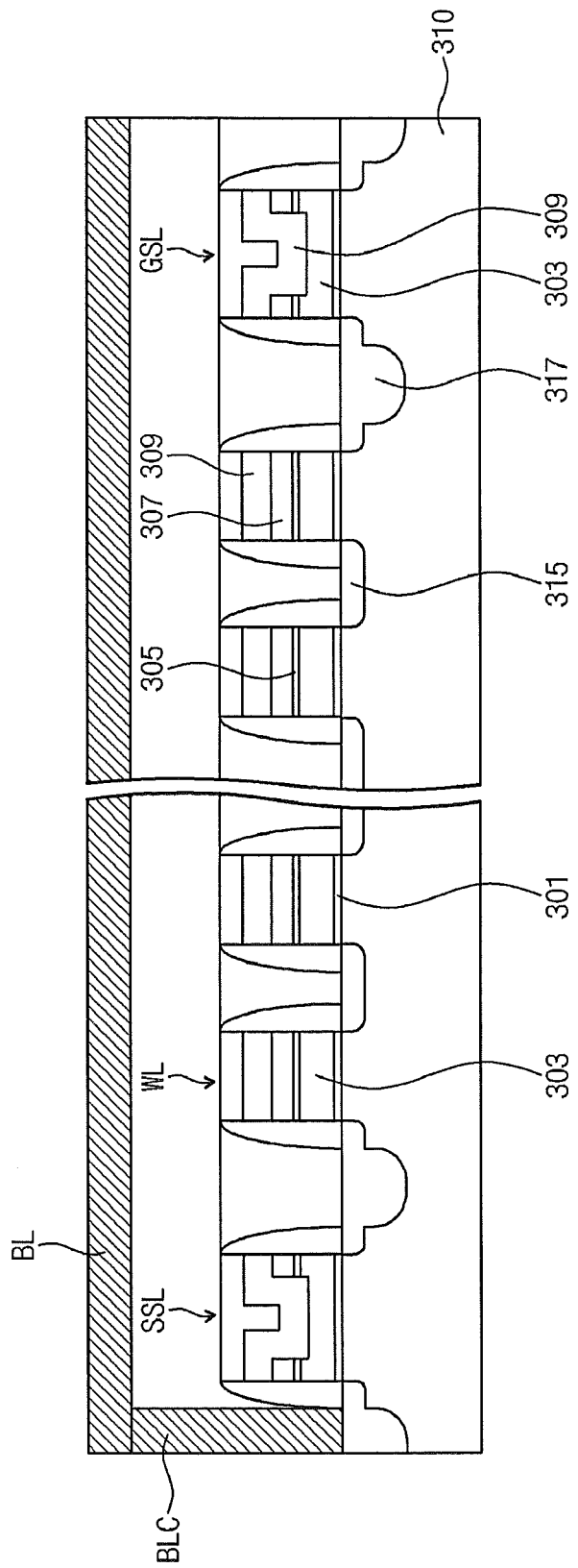
FIG. 21 is a cross-sectional view taken along the line F-F' of FIG. 20.

Patterning methods according to some embodiments of the present inventive concept may be applied to fabricate non-volatile memory devices, for example, as illustrated in FIGS. 20 and 21. FIG. 20 is a plan view of a non-volatile memory device formed using a method of forming patterns according to some embodiments of the present inventive concept. FIG. 21 is a cross-sectional view taken along the line F-F' of FIG. 20.

Referring to FIGS. 20 and 21, a plurality of line-shaped device isolation layers 313 may be formed in a substrate 310 to define active regions AR. A string selection line SSL, a ground selection line GSL, and word lines WL interposed therebetween may be provided spaced apart from each other on the substrate 310 and may cross over the active regions AR. Doped regions 315 and 317 may be provided in portions of the active region AR positioned between the lines SSL, WL, and GSL. Each of the word lines WL may include a tunnel insulating layer 301, a floating gate 303, a blocking insulating layer 305, and a control gate sequentially stacked on the substrate 310. The control gate may include a polysilicon layer 307 and a metal-containing layer 309. The metal-containing layer 309 in the ground selection line GSL and the string selection line SSL may be in contact with the floating gate 303 through the blocking insulating layer 305.

The doped region 317 disposed at a side of the string selection line SSL may be in contact with a bit line contact BLC. The bit line contact BLC may be connected to a corresponding one of the bit lines BL crossing over the lines SSL, WL, and GSL.

The lines SSL, GSL, WL, and BL may be formed using patterning methods according to some embodiments of the present inventive concept.

Figure 22:
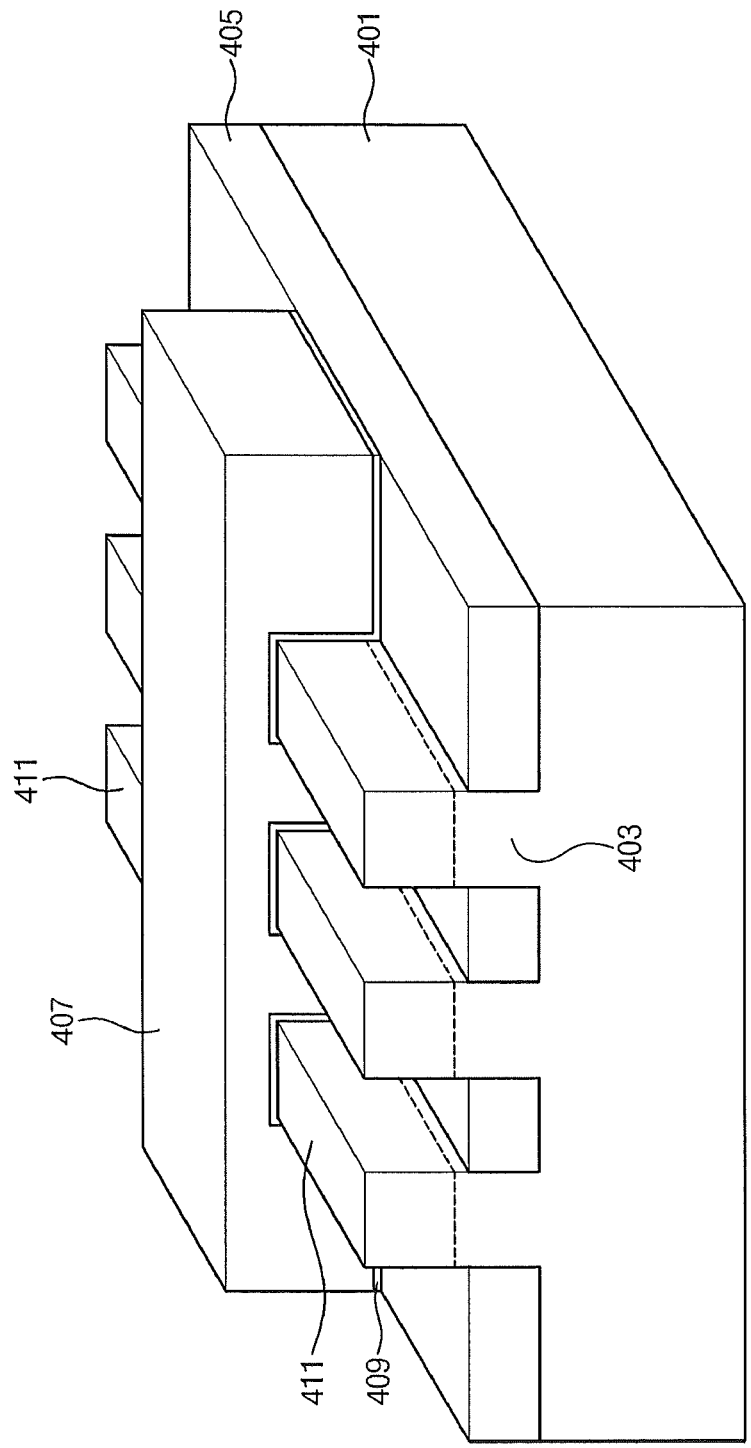
FIG. 22 is a perspective view of a fin-FET device formed using a method of forming patterns according to some embodiments of the present inventive concept.

Patterning methods according to some embodiments of the present inventive concept may be applied to fabricate Fin-FET devices, for example, as illustrated in FIG. 22. FIG. 22 is a perspective view of a fin-FET device formed using a method of forming patterns according to some embodiments of the present inventive concept.

Referring to FIG. 22, a plurality of line-shaped active fins 403 may protrude from a substrate 401. A device isolation layer 405 may be provided at both sides of each of the active fins 403. The device isolation layer 405 may have a top surface lower than those of the active fins 403. Gate electrodes 407 may be provided to cross over the active fins 403. A gate insulating layer 409 may be interposed between the gate electrode 407 and the active fins 403. Source/drain regions 411 may be provided in upper portions of the active fins 403 positioned at both sides of the gate electrode 407. The active fins 403 may be formed using patterning methods according to some embodiments of the present inventive concept.

According to some embodiments of the present inventive concept, patterning methods may include successively performing at least two exposure processes to a photoresist layer. The photoresist layer may include a negative type photoresist. In some embodiments, a pattern having a width smaller than a critical dimension of an exposure system may be formed. In some embodiments, manufacturing processes may be simplified or a number of manufacturing processes may be reduced compared with the double patterning technology. Accordingly, accuracy of the manufacturing processes may be improved.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming a pattern, comprising:
   forming an etch-target layer on a substrate;
   forming a photoresist layer on the etch-target layer;
   performing a first exposure process to transform first portions of the photoresist layer into first photoresist patterns spaced apart from each other;
   performing a second exposure process to transform second portions of the photoresist layer into second photoresist patterns spaced apart from each other;
   removing portions of the photoresist layer not transformed into the first and second photoresist patterns to expose a top surface of the etch-target layer;
   forming mask patterns in gaps between the first and second photoresist patterns after removing the portions of the photoresist layer;
   removing the first and second photoresist patterns; and
   etching the etch-target layer using the mask patterns as an etch mask,
   wherein each of the second photoresist patterns is disposed between two directly adjacent ones of the first photoresist patterns, and
   wherein the mask patterns are formed of a material having an etch selectivity with respect to the first and second photoresist patterns.

2. The method of claim 1, wherein each of the first and second photoresist patterns has a pillar shape.

3. The method of claim 1, wherein the mask patterns are formed of a metal-containing organic layer.

4. The method of claim 1, wherein each of the first and second photoresist patterns has a line shape.

5. The method of claim 1, wherein the photoresist layer is a negative type.

6. The method of claim 1, wherein the first and second exposure processes are performed using an immersion lithography process.

7. The method of claim 1, wherein a gap between two directly adjacent ones of the first photoresist patterns and a gap between two directly adjacent ones of the second photoresist patterns have an equivalent width in a first direction.

8. The method of claim 1, further comprising performing a third exposure process to transform third portions of the photoresist layer into third photoresist patterns spaced apart from each other after the second exposure process,
   wherein each of the third photoresist patterns is disposed between one of the first photoresist patterns and one of the second photoresist patterns.

9. The method of claim 8, wherein each of the first, second and third photoresist patterns has a line shape.

10. The method of claim 9, wherein gaps between the first, second and third photoresist patterns have an equivalent width in a first direction.

11. The method of claim 1, wherein each of the second photoresist patterns is spaced apart from two directly adjacent ones of the first photoresist patterns by an equal distance.

12. A method of forming a pattern, comprising:
   sequentially forming an etch-target layer and a photoresist layer on a substrate;
   performing a plurality of exposure processes to the photoresist layer to transform portions of the photoresist layer into photoresist patterns disposed at different positions;
   removing portions of the photoresist layer not transformed into the photoresist patterns;
   forming mask patterns in gaps between the photoresist patterns after removing the portions of the photoresist layer;
   removing the photoresist patterns; and
   etching the etch-target layer using the mask patterns as an etch mask,
   wherein the mask patterns are formed of a material having an etch selectivity with respect to the photoresist patterns.

13. The method of claim 12, wherein the plurality of exposure processes use respective different photomasks.

14. The method of claim 12, wherein the plurality of exposure processes use one mask, which is moved after each of the plurality of exposure processes.

15. The method of claim 12, wherein the mask patterns are formed of a metal-containing organic layer.

16. A method of forming an integrated circuit device, comprising:
   sequentially forming an etch-target layer and a photoresist layer on a substrate;
   exposing two first portions of the photoresist layer to light to transform the two first portions into two first photoresist patterns;
   exposing a second portion of the photoresist layer to light to transform the second portion into a second photoresist pattern disposed between the two first photoresist patterns;
   removing portions of the photoresist layer to leave the two first photoresist patterns and the second photoresist pattern on the etch-target layer such that the etch-target layer is exposed;
   forming mask patterns on the etch-target layer between the two first photoresist patterns and the second photoresist pattern after removing the portions of the photoresist layer;
   removing the two first photoresist patterns and the second photoresist pattern after forming the mask patterns; and
   etching the etch-target layer using the mask patterns as an etch mask,
   wherein the mask patterns are formed of a material having an etch selectivity with respect to the two first photoresist patterns and the second photoresist pattern.

17. The method of claim 16, wherein each of the two first photoresist patterns and the second photoresist pattern has a line shape extending in a direction.

18. The method of claim 16, further comprising:
   exposing a third portion of the photoresist layer to light to transform the third portion into a third photoresist pattern disposed between one of the two first photoresist patterns and the second photoresist pattern before removing the portions of the photoresist layer, wherein removing the portions of the photoresist layer leaves the third photoresist pattern on the etch-target layer.

19. The method of claim 16, wherein the second photoresist pattern is spaced apart from the two first photoresist patterns by an equal distance.

20. The method of claim 16, wherein the mask patterns are formed of a metal containing organic layer.

* * * * *